United States Patent
Yokomakura et al.

(10) Patent No.: US 8,423,862 B2
(45) Date of Patent: Apr. 16, 2013

(54) EXECUTION DECISION APPARATUS, RECEIVING APPARATUS, RADIO COMMUNICATION SYSTEM, AND EXECUTION DECISION METHOD

(75) Inventors: Kazunari Yokomakura, Osaka (JP); Yasuhiro Hamaguchi, Osaka (JP); Hideo Namba, Osaka (JP); Shimpei To, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 450 days.

(21) Appl. No.: 12/865,977

(22) PCT Filed: Feb. 4, 2009

(86) PCT No.: PCT/JP2009/051870
§ 371 (c)(1),
(2), (4) Date: Aug. 3, 2010

(87) PCT Pub. No.: WO2009/099092
PCT Pub. Date: Aug. 13, 2009

(65) Prior Publication Data
US 2011/0004803 A1   Jan. 6, 2011

(30) Foreign Application Priority Data
Feb. 5, 2008   (JP) .............................. P2008-025400

(51) Int. Cl.
*H03M 13/45* (2006.01)

(52) U.S. Cl.
USPC .......................................... 714/755; 714/780

(58) Field of Classification Search .................. 714/755, 714/780
See application file for complete search history.

(56) References Cited

U.S. PATENT DOCUMENTS

| 6,996,194 | B2* | 2/2006 | Pukkila et al. | 375/340 |
| 7,602,838 | B2* | 10/2009 | Bottomley et al. | 375/148 |
| 2001/0004390 | A1* | 6/2001 | Pukkila et al. | 375/340 |
| 2002/0037034 | A1* | 3/2002 | Penther | 375/229 |
| 2002/0167998 | A1* | 11/2002 | Penther | 375/229 |

(Continued)

FOREIGN PATENT DOCUMENTS

| JP | 2004-32467 A | 1/2004 |
| JP | 2007-129377 A | 5/2007 |

OTHER PUBLICATIONS

Haruka Obata et al., "A Study on an EXIT Chart-Aided Scheduling and Rate Control Technique for Multi-User MIMO Systems", IEICE Technical Report, RCS2006-260 (Mar. 2007), Feb. 2007, vol. 106, No. 555, pp. 103-106.

(Continued)

*Primary Examiner* — Stephen M Baker
(74) *Attorney, Agent, or Firm* — Birch Stewart Kolasch & Birch, LLP

(57) ABSTRACT

An execution decision apparatus decides whether to execute a detection process for a turbo equalization apparatus which detects data before coding, by repeating processes performed on transmission data coded by error correction coding, by an equalization unit for compensating distortion by a propagation path and a decoding unit for performing an error correction process, and includes an equalization unit I/O characteristic acquisition unit which acquires an I/O characteristic of the equalization unit; a decoding unit I/O characteristic acquisition unit which acquires an I/O characteristic of the decoding unit; and a decision unit which decides whether to execute the detection process in the turbo equalization apparatus based on the I/O characteristic acquired for each of the equalization unit and the decoding unit.

14 Claims, 15 Drawing Sheets

U.S. PATENT DOCUMENTS

2004/0132416 A1* 7/2004 Yee .................................. 455/82
2004/0153679 A1* 8/2004 Fitton et al. .................... 713/322
2006/0087960 A1* 4/2006 Kim et al. ...................... 370/203
2006/0262869 A1* 11/2006 Yoshida ......................... 375/260
2008/0115038 A1* 5/2008 Kee et al. ...................... 714/760

OTHER PUBLICATIONS

Berrou et al., "Near Shannon Limit Error-Correcting Coding and Decoding: Turbo-Codes (1)", in Proceedings of IEEE International Conference on Communication '93, Geneva, Switzerland, May 1993, pp. 1064-1070.

Dangl et al., "Convergence Behavior of Iterative Equalization and Decoding Schemes with Memory", IEEE Global Telecommunications Conference, 2003 (GLOBECOM'03), Dec. 2003, vol. 3, pp. 1710-1715.

Moghari et al., "Convergence Behavior of Iterative Turbo Multiuser Detection Algorithms", IEEE Wireless Communications and Networking Conference, 2005 (WCNC 2005), Mar. 2005, vol. 1, pp. 326-332.

* cited by examiner

| INPUT MUTUAL INFORMATION AMOUNT(Iin) | OUTPUT MUTUAL INFORMATION AMOUNT(Idec) |
|---|---|
| 0.1 | 0.00028 |
| 0.2 | 0.00907 |
| 0.3 | 0.06401 |
| 0.4 | 0.22268 |
| 0.5 | 0.48702 |
| 0.6 | 0.75561 |
| 0.7 | 0.92242 |
| 0.8 | 0.98469 |
| 0.9 | 1 |
| 1.0 | 1 | ns
EXECUTION DECISION APPARATUS, RECEIVING APPARATUS, RADIO COMMUNICATION SYSTEM, AND EXECUTION DECISION METHOD

This application claims priority to and the benefit of Japanese Patent Application No. 2008-025400 filed on Feb. 5, 2008, the disclosure of which is incorporated herein by reference.

FIELD OF THE INVENTION

The present invention relates to an execution decision apparatus, a receiving apparatus, a radio communication system, and an execution decision method.

BACKGROUND ART

Turbo coding and turbo decoding were discovered in 1993 (see Non-Patent Document 1). They are attracting attention as error correction coding that approaches a Shannon limit, which is a theoretical limit in communication.

An apparatus in which turbo coding is implemented (hereinafter, referred to as "turbo coding apparatus") includes two recursive systematic convolutional (RSC) coding units which have two common wire connections. The turbo coding apparatus inputs an input bit stream to the two RSC coding units. In this case, the turbo coding apparatus interleaves the bit stream through an interleaver and inputs it to one of the RSC coding units. Through this process, the turbo coding apparatus generates the bit stream which is convoluted under two independent constraint conditions.

An apparatus in which turbo decoding is implemented (hereinafter, referred to as "turbo decoding apparatus") includes two maximum a posteriori probability (MAP) estimation units. The two MAP estimation units decode the bit stream which is encoded by the turbo coding apparatus. The MAP estimation units detect the input bit stream with a high degree of accuracy by exchanging reliabilities obtained by respective decoding processes with each other.

As a scheme that focuses on two independent constraint conditions, a turbo equalization scheme has also been suggested. In the turbo equalization scheme, a coding process as a premise is executed by two coding units as follows: One performs convolutional coding (external coding) of a bit stream having the purpose of error correction. The other performs convolutional coding (internal coding) by an impulse response of a propagation path. The two independent coding units are connected in series.

An apparatus that receives the signal coded by the above-described coding process (hereinafter, referred to as "turbo equalization apparatus") includes an equalization unit which compensates distortion by the radio propagation path and a decoding unit which performs decoding. The equalization unit and the decoding unit use reliabilities obtained by their processes as prior information for their detection process. By repeating such a process, the turbo equalization apparatus gradually improves the accuracy of signal detection.

As an example of the turbo equalization scheme, a frequency-domain soft canceller followed by minimum mean square error (SC/MMSE) turbo equalization scheme will be described. FIGS. 16 and 17 illustrate a transmitting apparatus and a receiving apparatus for radio communication, particularly, mobile communication.

First, the transmitting apparatus will be described. In FIG. 16, the transmitting apparatus includes a coding unit P01, an interleaver P02, a modulation unit P03, a cyclic prefix (CP) insertion unit P04, a pilot generation unit P05, a pilot multiplexing unit P06, a radio unit P07, and a transmitting antenna P08.

The coding unit P01 executes error-correction coding for a bit stream to be transmitted (hereinafter, referred to as "transmission bit stream"). The interleaver P02 interleaves a bit sequence of the transmission bit stream. The modulation unit P03 performs modulation such as quadrature phase shift keying (QPSK) on the transmission bit stream whose sequence is interleaved. The CP insertion unit P04 inserts a CP into the transmission bit stream. The CP is aimed at removing interference of a delay wave caused by a multipath. In this case, the CP insertion unit P04 adds the CP in units of fast Fourier transform (FFT) blocks in the receiving apparatus depending on a maximum delay time of a propagation path.

The pilot generation unit P05 generates a known pilot signal for propagation path estimation. The pilot signal multiplexing unit P06 multiplexes a signal of the transmission bit stream into which the CP is inserted (hereinafter, referred to as "data signal") and the pilot signal generated by the pilot generation unit P05. The radio unit P07 up-converts the multiplexed signal into a radio frequency. The transmitting antenna P08 transmits the up-converted signal.

Next, the receiving apparatus will be described. In FIG. 17, the receiving apparatus includes a receiving antenna P11, a radio unit P12, a pilot separation unit P13, a propagation path characteristic/variance estimation unit P14, a CP removal unit P15, an FFT unit P16, a soft cancellation unit P17, an equalization unit P18, a demodulation unit P19, a de-interleaver P20, a decoding unit P21, an interleaver P22, a soft replica generation unit P23, and a propagation path characteristic multiplying unit P24.

The receiving antenna P11 receives a signal transmitted from the transmitting antenna P08 of the transmitting apparatus described above. The radio unit P12 down-converts the received signal from the radio frequency to a baseband signal. The pilot separation unit P13 separates the down-converted signal into the pilot signal and a data signal. The propagation path characteristic/variance estimation unit P14 estimates a frequency response of the propagation path (hereinafter, referred to as "propagation path characteristic") using the pilot signal. Further, the propagation path characteristic/variance estimation unit P14 estimates variance of thermal noise (hereinafter, referred to simply as "noise") of the receiving apparatus. The propagation path characteristic and the variance of thermal noise estimated are input to the equalization unit P18. Further, the estimated propagation path characteristic is input to the propagation path characteristic multiplying unit P24.

The CP removal unit P15 removes the CP from the separated data signal. The data signal maintains a periodic function characteristic of the signal in units of FFT blocks. The FFT unit P16 converts the data signal into the frequency signal. The frequency signal is input to the soft cancellation unit P17.

The processing processed hereafter is signal processing in the turbo equalization scheme. The turbo equalization scheme involves repeating processes in the soft cancellation unit P17, the equalization unit P18, the demodulation unit P19, the de-interleaver P20, the decoding unit P21, the interleaver P22, the soft replica generation unit P23, and the propagation path characteristic multiplying unit P24 an arbitrary number of times.

First, the soft cancellation unit P17 cancels a reception signal replica (a signal of an interference component in the propagation path) having an amplitude that is in proportion to reliability obtained by the propagation path characteristic multiplying unit P24, from the data signal. In a first process, since the soft replica is not generated by the soft replica generation unit P23, the reception signal replica is not generated. For this reason, the soft cancellation unit P17 does not perform a cancellation process. The equalization unit P18 receives the propagation path characteristic output by the propagation path characteristic/variance estimation unit P14, the soft replica obtained by the soft replica generation unit P23, and the data signal cancelled by the soft cancellation unit P17. The equalization unit P18 executes a process of compensating distortion of the signal in the propagation path (equalization process) using the propagation path characteristic, the soft replica, and the soft-canceled data signal. The demodulation unit P19 computes a log likelihood ratio (LLR) of each receiving data signal through a demodulation process.

The de-interleaver P20 restores the bit stream of the data signal to the original sequence. The decoding unit P21 executes an error correction process for the LLR of each data signal restored to the original sequence and computes the LLR of each data signal with improved reliability. The interleaver P22 re-interleaves the LLR output by the decoding unit P21 again. The interleaver P22 performs interleaving in the same pattern as the interleaver P02 of the transmitting apparatus. The soft replica generation unit P23 generates the replica having an amplitude which is in proportion to reliability. For example, if the QPSK, which is the modulation scheme in the modulation unit P03 of the transmitting apparatus, is used as a modulation scheme, and the LLR of a first bit constituting a QPSK signal is 11 and the LLR of a second bit is 12, the soft replica $s_{soft}$ is expressed by Formula 1.

[Formula 1]

$$s_{soft} = \frac{1}{\sqrt{2}}\tanh\left(\frac{l_1}{2}\right) + j\frac{1}{\sqrt{2}}\tanh\left(\frac{l_2}{2}\right) \quad \text{(FORMULA 1)}$$

When the soft replica is obtained by Formula 1, the soft replica generation unit P23 inputs the soft replica to the equalization unit P18. Further, the soft replica is converted into the frequency signal by an FFT unit of the soft replica generation unit P23 and input to the propagation path characteristic multiplying unit P24. The propagation path characteristic multiplying unit P24 generates the reception signal replica by multiplying the frequency signal of the soft replica by the propagation path characteristic estimated by the propagation path characteristic/variance estimation unit P14. The generated reception signal replica is input to the soft cancellation unit P17 as described above. The receiving apparatus repeats the above-described process an arbitrary number of times and finally determines the LLR obtained by the decoding unit P21 to perform signal detection, thereby obtaining the decoded bit stream (hereinafter, referred to as "decoded bit stream").

[Non-Patent Document 1] C. Berrou, A. Glavieux, and P. Thitimajshima, "Near shannon limit error correcting coding and decoding: Turbo-codes (1)," in Proceedings of IEEE International Conference on Communications '93, (Geneva, Switzerland), pp. 1064-1070, May 1993.

DISCLOSURE OF INVENTION

Problems to be Solved by the Invention

As described above, the turbo equalization scheme exchanges pieces of information obtained by the equalization unit and the decoding unit a predetermined number of times with each other to gradually improve reliability of the bit stream of the data signal and perform signal detection. Through such a process, it is possible to improve the signal detection accuracy. However, there was a problem with increasing time and power consumption required by the process. The increases of the time and power consumption are caused by increasing the number of times a repetition process in signal detection is executed.

Therefore, it is an object of the present invention to provide an execution decision apparatus, a receiving apparatus, a radio communication system, and an execution decision method in which in the turbo equalization scheme, it is possible to prevent the signal detection accuracy from deteriorating and reduce the number of times a repetition process is executed.

Means for Solving the Problems

According to a first aspect of the present invention, there is provided an execution decision apparatus which decides whether to execute a detection process for a turbo equalization apparatus which detects data before coding, by repeating processes performed on transmission data coded by error correction coding, by an equalization unit for compensating distortion by a propagation path and a decoding unit for performing an error correction process, the execution decision apparatus including: an equalization unit I/O characteristic acquisition unit which acquires an I/O characteristic of the equalization unit; a decoding unit I/O characteristic acquisition unit which acquires an I/O characteristic of the decoding unit; and a decision unit which decides whether to execute the detection process in the turbo equalization apparatus based on the I/O characteristics acquired for each of the equalization unit and the decoding unit.

In the first aspect of the present invention, the decision unit may evaluate whether or not a stack will occur when the detection process in the turbo equalization apparatus is repeated, based on the I/O characteristics acquired for each of the equalization unit and the decoding unit, decide that the detection process is not to be performed when it is evaluated that the stack will occur, and decide that the detection process is to be performed when it is evaluated that the stack will not occur.

In the first aspect of the present invention, the equalization unit I/O characteristic acquisition unit may acquire an I/O characteristic related to a mutual information amount of the equalization unit, the decoding unit I/O characteristic acquisition unit may acquire an I/O characteristic related to a mutual information amount of the decoding unit, and the decision unit may evaluate that the stack will occur and decide that the detection process is not to be executed when the two I/O characteristics intersect, and evaluate that the stack will not occur and decide that the detection process is to be executed when the two I/O characteristics do not intersect.

In the first aspect of the present invention, the decision unit may compare relative sizes of respective output values at a plurality of evaluation points based on the two I/O characteristics, and evaluate that the two I/O characteristics do not intersect when magnitude relations of the relative sizes of all the evaluation points are identical.

In the first aspect of the present invention, the execution decision apparatus may further include an evaluation point setting unit which sets values of the plurality of evaluation points by setting an interval between the plurality of evaluation points based on the I/O characteristic of the equalization unit.

In the first aspect of the present invention, the equalization unit I/O characteristic unit may acquire the I/O characteristic of the equalization unit by acquiring an output mutual information amount when an input mutual information amount of the equalization unit is zero and an output mutual information amount when the input mutual information amount is "1," and performing approximation using values of the two output mutual information amounts.

In the first aspect of the present invention, the execution decision apparatus may further include a number acquisition unit which acquires a repetition number for a repetition process in the turbo equalization apparatus based on an input characteristic of the equalization unit and an input characteristic of the decoding unit.

In the first aspect of the present invention, when the turbo equalization apparatus has a maximum value of the number of times the repetition process is executed, in advance, the number acquisition unit may decide that the detection process is not to be executed when an acquired repetition number exceeds the maximum value of the number of times the repetition process is executed in the turbo equalization apparatus.

In the first aspect of the present invention, the execution decision apparatus may further include: a table storage unit which stores a table including a correspondence between a plurality of input values and output values for the respective input values with respect to the input characteristic of the decoding unit, and the decoding unit input characteristic acquisition unit may acquire an input characteristic by reading content of the table from the table storage unit.

According to a second aspect of the present invention, a receiving apparatus is provided including the execution decision apparatus described above.

According to a third aspect of the present invention, a radio communication system is provided, including: a transmitting apparatus comprising a coding unit which performs coding by error correction code on data and a transmitting unit which transmits the data coded by the coding unit; and a receiving apparatus comprising a receiving unit which receives data transmitted by the transmitting apparatus, a turbo equalization unit which detects data before coding by repeating processes performed on the data received by the receiving unit by an equalization unit which compensates distortion by a propagation path and a decoding unit which performs an error correction process, an equalization unit I/O characteristic acquisition unit which acquires an I/O characteristic of the equalization unit, a decoding unit I/O characteristic acquisition unit which acquires an I/O characteristic of the decoding unit, and a decision unit which decides whether to execute a detection process in the turbo equalization unit based on the I/O characteristic acquired for each of the equalization unit and the decoding unit.

In the third aspect of the present invention, the decision unit may evaluate whether or not a stack will occur when repeating the detection process in the turbo equalization unit based on the I/O characteristic acquired for each of the equalization unit and the decoding unit, decide that the detection process is not to be performed when it is evaluated that the stack will occur, and decide that the detection process is to be performed when it is evaluated that the stack will not occur.

According to a fourth aspect of the present invention, there is provided an execution decision method executed by the execution decision apparatus described above.

Effects of the Invention

According to the present invention, it is possible to prevent the signal detection accuracy from deteriorating and reduce the number of times a repetition process is executed in the turbo equalization scheme.

Figure 1:
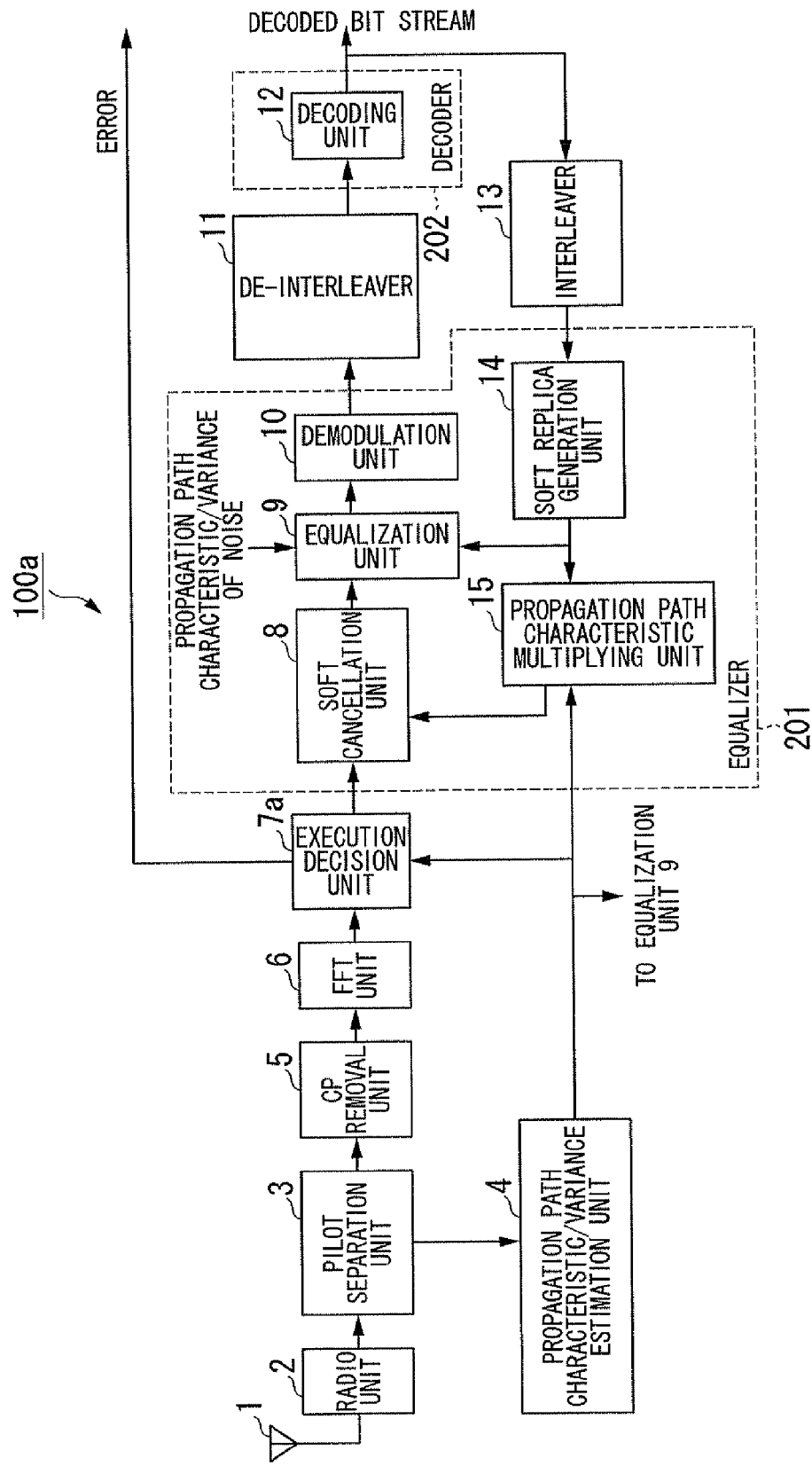
FIG. 1 is a schematic block diagram illustrating a functional configuration of a receiving apparatus according to a first embodiment.

| [Description of Reference numerals] | |
| --- | --- |
| P01: | Coding unit |
| P02: | Interleaver |
| P03: | Modulation unit |
| P04: | CP insertion unit |
| P05: | Pilot generation unit |
| P06: | Pilot multiplexing unit |
| P07: | Radio unit |
| P08: | Transmitting antenna |
| P11: | Receiving antenna |
| P12: | Radio unit |
| P13: | Pilot separation unit |
| P14: | Propagation path characteristic/variance estimation unit |
| P15: | CP removal unit |
| P16: | FFT unit |

-continued

[Description of Reference numerals]

| | |
|---|---|
| P17: | Soft cancellation unit |
| P18: | Equalization unit |
| P19: | Demodulation unit |
| P20: | De-interleaver |
| P21: | Decoding unit |
| P22: | Interleaver |
| P23: | Soft replica generation unit |
| P24: | Propagation path characteristic multiplying unit |
| 1: | Receiving antenna |
| 2: | Radio unit |
| 3: | Pilot separation unit |
| 4: | Propagation path characteristic/variance estimation unit |
| 5: | CP removal unit |
| 6: | FFT unit |
| 7: | Execution decision unit |
| 8: | Soft cancellation unit |
| 9: | Equalization unit |
| 10: | Demodulation unit |
| 11: | De-interleaver |
| 12: | Decoding unit |
| 13: | Interleaver |
| 14: | Soft replica generation unit |
| 15: | Propagation path characteristic multiplying unit |
| 16: | Number control unit |
| 71: | Equalizer I/O characteristic acquisition unit |
| 72: | Decoder I/O characteristic acquisition unit |
| 73: | Storage unit |
| 74: | Decision unit |
| 75: | Evaluation point setting unit |
| 76: | Number acquisition unit |
| 100: | Receiving apparatus |
| 201: | Equalizer |
| 202: | Decoder |

BEST MODE FOR CARRYING OUT THE INVENTION

First Embodiment

First, a receiving apparatus 100a according to a first embodiment will be described. FIG. 1 is a schematic block diagram illustrating a functional configuration of the receiving apparatus 100a. The receiving apparatus 100a employs a frequency-domain SC/MMSE turbo equalization scheme to a single carrier scheme. However, a scheme which may be employed by the receiving apparatus 100a is not limited thereto. The receiving apparatus 100a may employ any other scheme that can use the turbo equalization scheme in the receiving apparatus. For example, the receiving apparatus 100a may employ a discrete Fourier transform spread orthogonal frequency division multiplexing (DFT-S-OFDM) scheme, an MC-CDMA method, or an OFDM method. The receiving apparatus 100a may employ a scheme of receiving a signal, to which a CP is added, transmitted by the transmitting apparatus. A scheme which may be employed by the receiving apparatus 100a is not limited to the frequency-domain SC/MMSE. The receiving apparatus 100a may employ a time-domain SC/MMSE or a maximum a posteriori probability (MAP) equalization.

Figure 16:
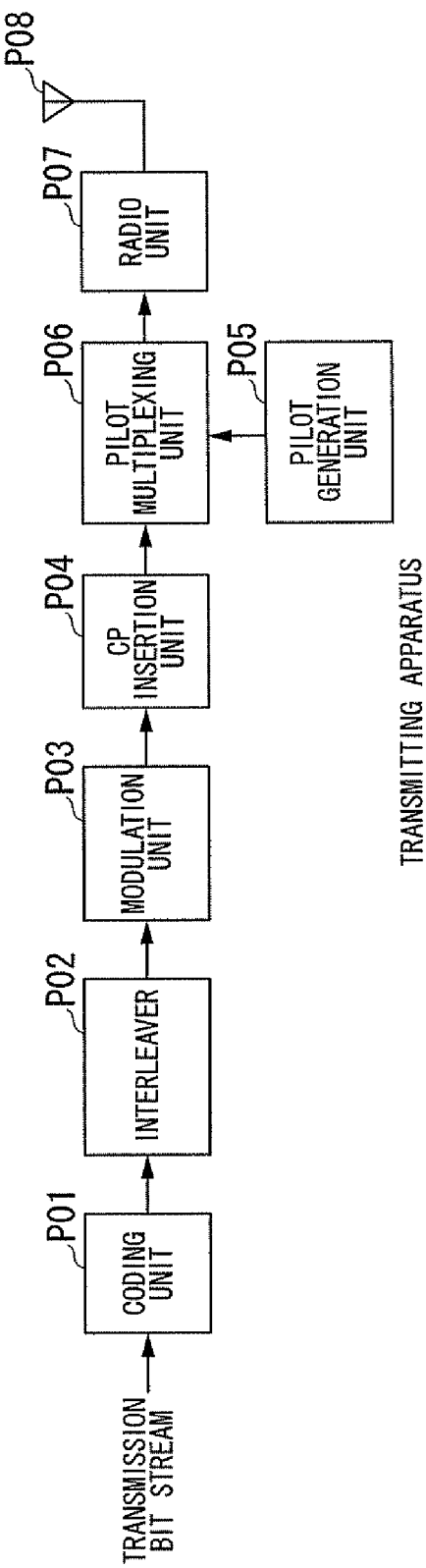
FIG. 16 is a schematic block diagram illustrating a functional configuration of a transmitting apparatus in which a turbo equalization scheme is implemented.
Figure 17:
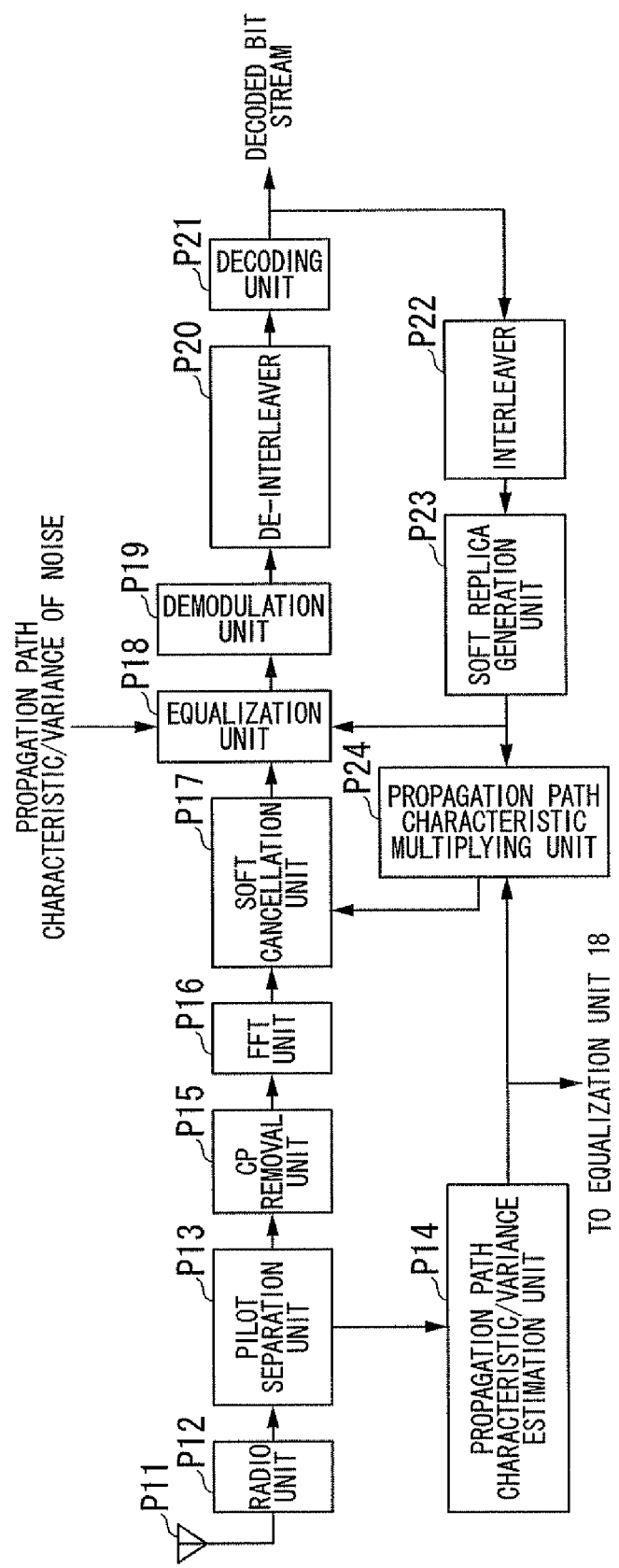
FIG. 17 is a schematic block diagram illustrating a functional configuration of a receiving apparatus in which a turbo equalization scheme is implemented.

The receiving apparatus 100a includes a receiving antenna 1, a radio unit 2, a pilot separation unit 3, a propagation path characteristic/variance estimation unit 4, a CP removal unit 5, a fast Fourier transform (FFT) unit 6, an execution decision unit 7a, a soft cancellation unit 8, an equalization unit 9, a demodulation unit 10, a de-interleaver 11, a decoding unit 12, an interleaver 13, a soft replica generation unit 14, and a propagation path characteristic multiplying unit 15. A transmitting apparatus which is a transmission source of a signal received by the receiving apparatus 100a is the same as the conventional transmitting apparatus illustrated in FIG. 16, and thus a description thereof will be omitted.

The receiving antenna 1 receives a signal transmitted from the transmitting apparatus. The radio unit 2 down-converts the received signal from a radio frequency to a baseband signal. The pilot separation unit 3 separates the down-converted signal into a pilot signal and a data signal. The propagation path characteristic/variance estimation unit 4 estimates a propagation path characteristic using the pilot signal. The propagation path characteristic/variance estimation unit 4 also estimates variance of noise in the receiving apparatus using the pilot signal. The estimated propagation path characteristic and noise variance are input to the equalization unit 9. The estimated propagation path characteristic is also input to the propagation path characteristic multiplying unit 15.

The CP removal unit 5 removes the CP from the separated data signal. The FFT unit 6 converts the data signal as a time signal into a frequency signal by an FFT process. The execution decision unit 7a decides whether to execute signal detection through a repetition process using the turbo equalization scheme by using the propagation path characteristic and the noise variance. When it is decided that the signal detection is to be executed, the execution decision unit 7a inputs the data signal input from the FFT unit 6 to the soft cancellation unit 8. In this case, the respective functional units subsequent to the soft cancellation unit 8 execute signal detection based on the turbo equalization scheme. When the execution decision unit 7a decides that the signal detection is not to be executed, the respective functional units subsequent to the soft cancellation unit 8 do not execute signal detection based on the turbo equalization scheme.

Next, the signal detection process based on the turbo equalization scheme through the respective functional units subsequent to the soft cancellation unit 8 will be described. First, the soft cancellation unit 8 cancels the reception signal replica from the data signal which is input from the execution decision unit 7a. The reception signal replica has amplitude which is in proportion to reliability. The reception signal replica is acquired by the propagation path characteristic multiplying unit 15. In a first process, since the soft replica is not generated by the soft replica generation unit 14, the reception signal replica is not generated. Therefore, the soft cancellation unit 8 does not perform a cancellation process. The equalization unit 9 receives the propagation path characteristic output from the propagation path characteristic/variance estimation unit 4, the soft replica obtained by the soft replica generation unit 14, and the data signal subjected to the cancellation in the soft cancellation unit 8. The equalization unit 9 executes a process of compensating for the distortion of a signal in the propagation path (equalization process) using the propagation path characteristic, the soft replica, and the soft-canceled data signal. The demodulation unit 10 computes a log likelihood ratio (LLR) of each data signal.

The de-interleaver 11 restores the original sequence of the bit stream of the data signal. The decoding unit 12 executes an error correction process for the LLR of each receiving data signal of which the original sequence has been restored and computes the LLR of each data signal having improved reliability. The interleaver 13 re-interleaves the LLR output from the decoding unit 12. The soft replica generation unit 14 generates the soft replica having the amplitude which is in proportion to the reliability. The soft replica unit 14 obtains the soft replica, for example, using Formula 1. When the soft replica is obtained, the soft replica generation unit 14 inputs the soft replica to the equalization unit 9. The soft replica is converted into a frequency signal by an FFT unit, which is not shown, and input to the propagation path characteristic multiplying unit 15. The propagation path characteristic multiplying unit 15 multiplies the propagation path characteristic estimated by the propagation path/variance estimation unit 4 by the frequency signal of the soft replica to generate a reception signal replica. The generated reception signal replica is input to the soft cancellation unit 8, as described above. The respective functional units subsequent to the soft cancellation unit 8 perform signal detection to obtain decoded bits by repeating the above-described process an arbitrary number of times and finally determining the LLR obtained by the decoding unit 12.

Figure 2:
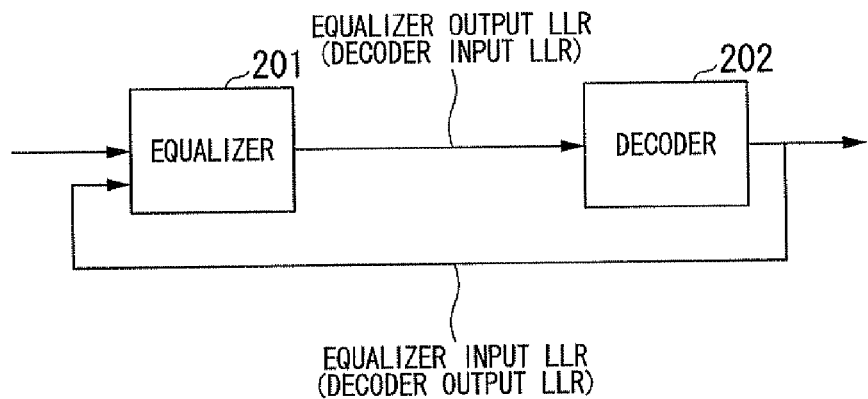
FIG. 2 is a schematic diagram illustrating a functional configuration for implementing a turbo equalization scheme.
Figure 3:
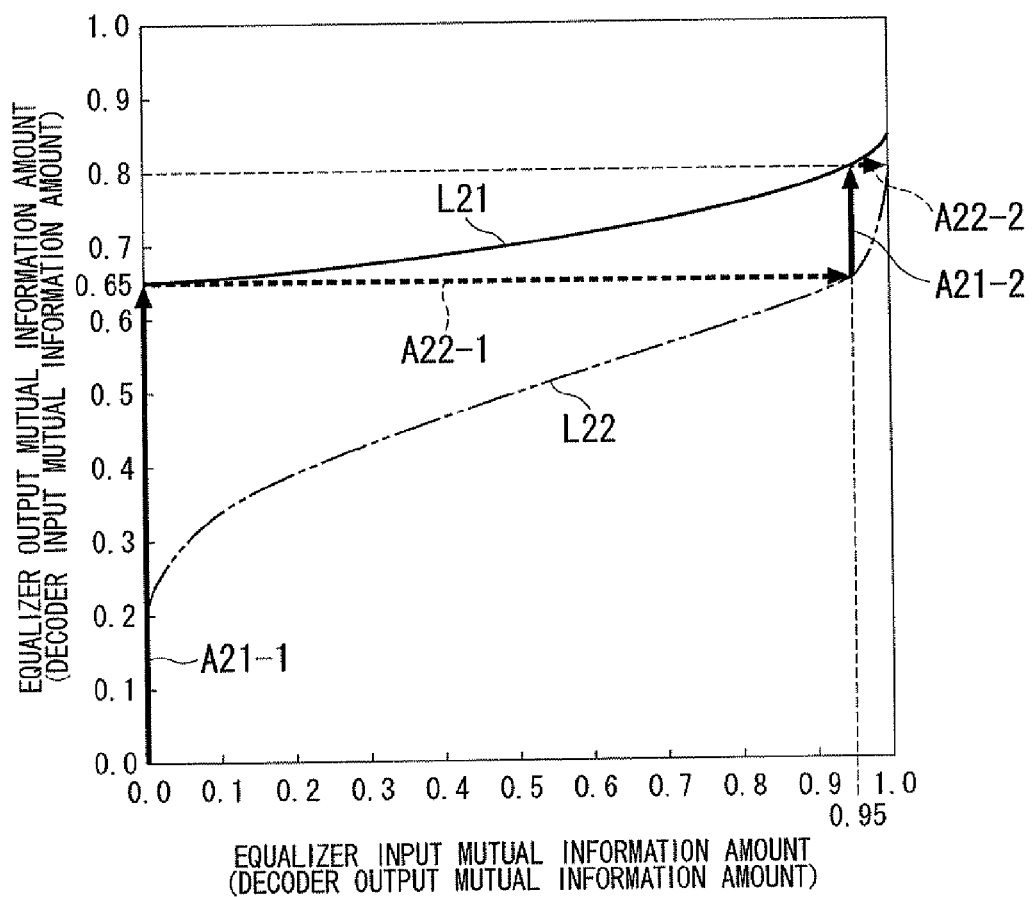
FIG. 3 is an EXIT chart visually illustrating a repetition process.

The functional configuration of the receiving apparatus 100a has been described above. A theoretical mechanism of the turbo equalization scheme will now be described. FIG. 2 is a schematic diagram illustrating a functional configuration for implementing the turbo equalization scheme. FIG. 3 is an extrinsic information transfer (EXIT) chart that visually represents a repetition process.

As illustrated in FIG. 2, the typical turbo equalization scheme is implemented by using an equalizer 201 that obtains reliability from convolution of the propagation path and a decoder 202 that obtains reliability through an error-correction process. The equalizer 201 and the decoder 202 exchange reliability values of the data signal with each other and utilize the reliability values as prior information for mutual signal detection. Therefore, an equalization unit output LLR becomes a decoding unit input LLR. Further, a decoding unit output LLR becomes an equalization unit input LLR.

Specifically, the equalizer 201 corresponds to the soft cancellation unit 8, the equalization unit 9, the demodulation unit 10, the soft replica generation unit 14, and the propagation path characteristic multiplying unit 15 shown in FIG. 1. Further, the decoder 202 corresponds to the decoding unit 12 shown in FIG. 1. In FIG. 2, for simplification of description, the functional units corresponding to the de-interleaver 11 and the interleaver 13 are not shown. However, the two functional units are disposed between the equalizer 201 and the decoder 202 in principle.

In the EXIT chart shown in FIG. 3, the processes in the equalizer 201 and the decoder 202 are quantified and visually represented. In FIG. 3, a horizontal axis of the EXIT chart denotes an equalizer extrinsic input mutual information amount and a decoder extrinsic output mutual information amount. In FIG. 3, a vertical axis denotes an equalizer extrinsic output mutual information amount and a decoder extrinsic input mutual information amount. The extrinsic mutual information amount represents a mutual information amount that is improved only through processes directly before the equalizer 201 or the decoder 202, and the mutual information amount by reliability recognized at the time of input is reduced. Hereinafter, the extrinsic mutual information amount is referred to simply as "mutual information amount."

The mutual information amount quantitatively represents an amount of information which is obtained from a reception signal Y with respect to a transmission signal X when the transmission signal X is transmitted and so the reception signal Y is obtained. Further, the extrinsic mutual information amount represents an LLR obtained by dividing an output LLR by an input LLR, that is, a mutual information amount improved only through an immediately previous process. In this case, the mutual information amount for the data signal when the LLR is obtained is constrained to a value between "0" and "1." Further, the mutual information amount of "0" means that information on the data signal is not obtained. The mutual information amount of "1" means that information on the data signal is completely obtained, that is, that the data signal can be completely reproduced.

In FIG. 3, an I/O relationship of the mutual information amount of the equalizer 201 is indicated by a curve L21 and an I/O relationship of the mutual information amount of the decoder 202 is indicated by a curve L22. A repetition process is visually represented by an arrow (which is called "EXIT locus"). First, in a first repetition process, since prior information is not obtained at all, the input mutual information amount of the equalizer 201 is "0." The equalizer 201 obtains an equalizer output mutual information amount (0.65) along an arrow A 21-1.

Next, since an output mutual information amount of the equalizer 201 is an input mutual information amount of the decoder 202, the equalizer output mutual information amount is input to the decoder 202. The decoder 202 obtains an output mutual information amount (0.95) along an arrow A22-1. Here, since the process of each of the equalizer 201 and the decoder 202 has been completed once, the first repetition process is completed.

Next, the equalizer 201 obtains the output mutual information amount (0.8) along an arrow A21-2 using the output mutual information amount of the decoder 202 as an input mutual information amount of the equalizer 201. The decoder 202 obtains the output mutual information amount (1) along an arrow A22-2 using the output mutual information amount of the equalizer 201 as an input mutual information amount of the decoder 202. At this time, since the obtained decoder output mutual information amount has reached "1," a signal can be detected without an error by performing demodulation in this step.

As described above, the repetition process in the equalizer 201 and the decoder 202 can obtain "1" as the decoder output mutual information amount if the I/O characteristics of the mutual information amount of the equalizer 201 and the decoder 202 do not intersect. On the other hand, if the I/O characteristics (that is, curves 21 and 22) intersect in the middle, the repetition process stops at an intersection point (stack), and the characteristics are not improved any more.

The I/O characteristic of the mutual information amount of the equalizer 201 (hereinafter, referred to as "the I/O characteristic of the equalizer 201" or "the equalizer I/O characteristic") is determined based on the propagation path characteristic and a signal to noise power ratio (SNR), and so an I/O relationship of the mutual information amount in the equalizer 201 changes at every transmission opportunity. Therefore, for adaptive control, it is necessary to compute a snapshot of the I/O characteristic at every transmission opportunity. On the other hand, the I/O characteristic of the mutual information amount of the decoder 202 (hereinafter, referred to as "the I/O characteristic of the decoder 202" or "the decoder I/O characteristic") is uniquely determined since all data signals are subjected to the same error correction coding by the transmitting apparatus.

Figure 4:
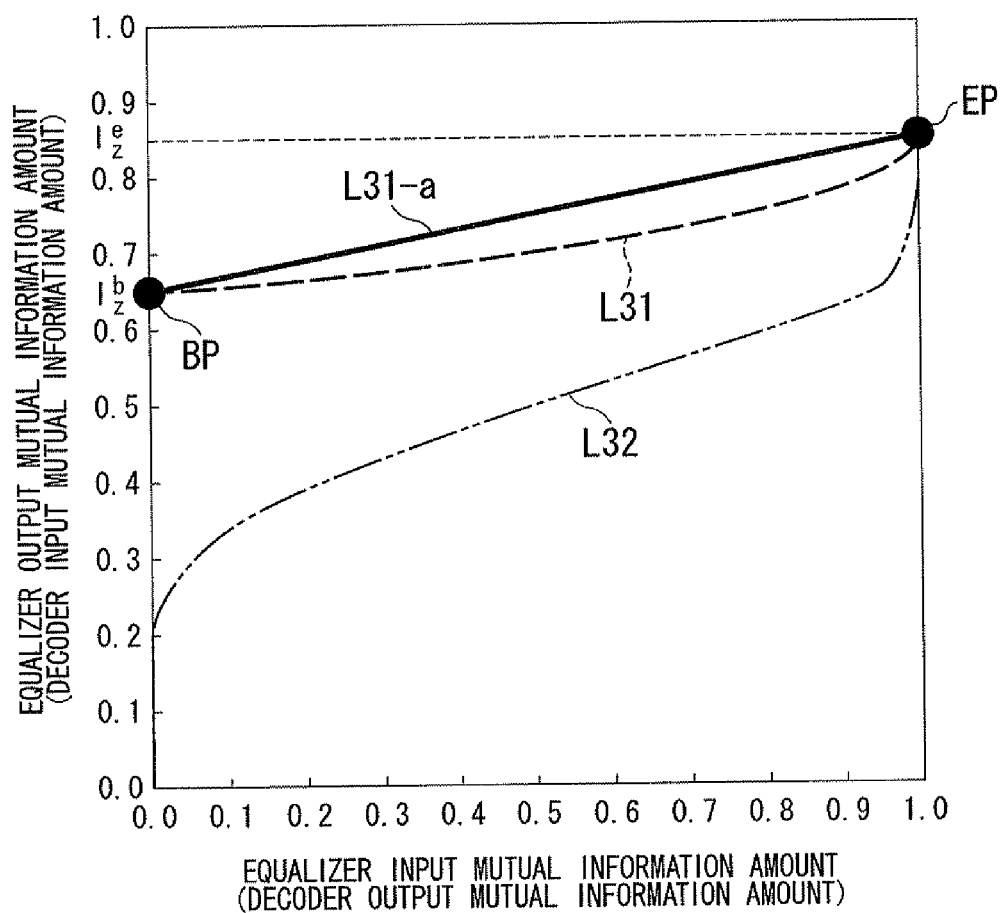
FIG. 4 is an EXIT chart illustrating an operation principle of an execution decision unit.

Next, an operation principle of the execution decision unit 7a will be described. FIG. 4 shows an EXIT chart illustrating the operation principle of the execution decision unit 7a. L31 denotes an actual I/O characteristic of the equalizer 201. L32 denotes an actual I/O characteristic of the decoder 202. The I/O characteristic L32 of the decoder 202 is uniquely determined as described above. Therefore, it is possible to obtain the I/O characteristic of the decoder 202 in advance. However, since the I/O characteristic of the equalizer 201 is determined based on the propagation path characteristic and the SNR as described above, it is difficult to obtain the I/O characteristic in advance.

However, it is possible to obtain a value of the equalizer output mutual information amount (a value of the equalizer output mutual information amount at a starting point BP) when the equalizer input mutual information amount is "0," in advance, before starting the repetition process since the information on the soft replica is not completely obtained and is identical to the actual signal. It is also possible to obtain the equalizer output mutual information amount (the equalizer output mutual information amount at an end point EP) when the equalizer input mutual information amount is "1," in advance, before starting the repetition process since the soft replica accuracy is completely identical to the transmission signal. Therefore, it is possible to compute an approximation characteristic L31-a of the equalizer 201 by approximating the starting point BP and the end point EP by a straight line.

Next, a method of computing the approximation characteristic L31-a will be described. Formula 2 represents an output signal vector of the equalizer 201.

[Formula 2]

$$z = (1+\gamma\delta)^{-1}[\delta s_{soft} + F^H \Psi R_{res}] \quad \text{(FORMULA 2)}$$

In Formula 2, z denotes a column vector of a complex number of a time axis which has a reception signal after equalization in the FFT block as an element. $s_{soft}$ denotes a column vector of a complex number representing the soft replica of the time axis in the FFT block. $\gamma, \delta, F, \psi$, and $R_{res}$ are values represented by Formulas 3 to 7, respectively.

[Formula 3]

$$\gamma = \frac{1}{K} tr\left[\Xi^H (\Xi\Delta\Xi^H + \sigma^2 I_K)^{-1} \Xi\right] \quad \text{(FORMULA 3)}$$

[Formula 4]

$$\delta = \frac{1}{K} tr[s_{soft} s_{soft}^H] = \frac{1}{K} \sum_{k=1}^{K} |s_{soft}(k)|^2 \quad \text{(FORMULA 4)}$$

[Formula 5]

$$F = \frac{1}{\sqrt{K}} \begin{bmatrix} 1 & 1 & 1 & 1 \\ 1 & e^{-j2\pi\frac{1}{K}} & \cdots & e^{-j2\pi\frac{K-1}{K}} \\ \vdots & \vdots & \ddots & \vdots \\ 1 & e^{-j2\pi\frac{K-1}{K}} & \cdots & e^{-j2\pi\frac{(K-1)(K-1)}{K}} \end{bmatrix} \quad \text{(FORMULA 5)}$$

[Formula 6]

$$\Psi = \Xi^H (\Xi\Delta\Xi^H + \sigma^2 I_K)^{-1} \quad \text{(FORMULA 6)}$$

[Formula 7]

$$R_{res} = R - \Xi S_{soft} \quad \text{(FORMULA 7)}$$

K denotes the number of signals (samples) in the FFT block. $\Xi$ denotes a diagonal matrix of a complex number in which the frequency responses (propagation path characteristics) of the propagation path are arranged as diagonal elements. $\Delta$ denotes a diagonal matrix of a non-negative real number in which remaining signal energies after soft cancellation are arranged as diagonal elements. $s_{soft}(k)$ denotes a k-th soft replica in the FFT block. F denotes a DFT matrix for time-frequency converting the vector. $S_{soft}$ denotes a column vector of a complex number in which the soft replicas of the frequency axis are arranged. R denotes a column vector of a complex number which has the reception signals of the frequency axis of FFT point numbers as elements. $I_k$ denotes a K×K unit matrix in which only diagonal elements are "1" and the remaining elements are "0." A superscript H denotes a Hermitian transpose (an adjoint matrix) of a vector or a matrix. tr[A] denotes a trace operator for computing a sum of diagonal elements of a square matrix A.

Even if the energy of the transmitted signal is normalized to "1," generality is not lost. If the energy of the transmitted signal is normalized to "1," $\Xi, \Delta, s_{soft}, S_{soft}, R$, and $R_{res}$ is expressed by Formulas 8 to 13, respectively, for example, when the FFT block size is "4."

[Formula 8]

$$\Xi = \begin{bmatrix} \Xi_1 & 0 & 0 & 0 \\ 0 & \Xi_2 & 0 & 0 \\ 0 & 0 & \Xi_3 & 0 \\ 0 & 0 & 0 & \Xi_4 \end{bmatrix} \quad \text{(FORMULA 8)}$$

[Formula 9]

$$\Delta = \begin{bmatrix} 1-|s_{soft}(1)|^2 & 0 & 0 & 0 \\ 0 & 1-|s_{soft}(2)|^2 & 0 & 0 \\ 0 & 0 & 1-|s_{soft}(3)|^2 & 0 \\ 0 & 0 & 0 & 1-|s_{soft}(4)|^2 \end{bmatrix} \quad \text{(FORMULA 9)}$$

[Formula 10]

$$S_{soft} = \begin{bmatrix} S_{soft}(1) \\ S_{soft}(2) \\ S_{soft}(3) \\ S_{soft}(4) \end{bmatrix} \quad \text{(FORMULA 10)}$$

[Formula 11]

$$S_{soft} = \begin{bmatrix} S_{soft}(1) \\ S_{soft}(2) \\ S_{soft}(3) \\ S_{soft}(4) \end{bmatrix} = F s_{soft} \quad \text{(FORMULA 11)}$$

[Formula 12]

$$R = \begin{bmatrix} R(1) \\ R(2) \\ R(3) \\ R(4) \end{bmatrix} \quad \text{(FORMULA 12)}$$

[Formula 13]

$$R_{res} = \begin{bmatrix} R_{res}(1) \\ R_{res}(2) \\ R_{res}(3) \\ R_{res}(4) \end{bmatrix} \quad \text{(FORMULA 13)}$$

Next, the LLR after equalization is computed using Formula 2. Parameters necessary for computing the LLR are an equivalent amplitude gain and variance of equivalent noise, which is, for example, expressed by Formulas 14 and 15, respectively.

[Formula 14]

$$\mu_z = \frac{1}{K} tr[\Xi^H (\Xi \Delta \Xi^H + \sigma^2 I_K)^{-1} \Xi] \quad \text{(FORMULA 14)}$$

[Formula 15]

$$\sigma_z^2 = \frac{\mu_z}{1 - \mu_z} \quad \text{(FORMULA 15)}$$

$\mu_z$ denotes a certain non-negative equivalent amplitude gain in the FFT block. $\sigma^2$ denotes variance of certain equivalent noise in the FFT block. The variance of the equivalent noise is expressed using only the equivalent amplitude gain consequently by subtracting a square of a mean value from a square mean value based on a definition. This uses the fact that the amplitude of the transmitted signal is normalized to "1," and the equivalent amplitude gain $\mu_z$ at this time is a mean value. In this case, the variance of the LLR is expressed, for example, as Formula 16 using the equivalent amplitude gain.

[Formula 16]

$$\sigma_l^2 = \frac{4\mu_z}{1 - \mu_z} \quad \text{(FORMULA 16)}$$

$\sigma_1^2$ denotes the variance of the LLR and is a positive real number. The LLR variance and the mutual information amount can be translated into each other and is, for example, expressed as in Formula 17 using an approximation formula called a J function.

[Formula 17]

$$I_z = \left(1 - 2^{-H_1 \sigma_l^{2H_2}}\right)^{H_3} \quad \text{(FORMULA 17)}$$

In Formula 17, $H_1=0.3073$, $H_2=0.8935$, and $H_3=1.1064$. In Formula 17, the values of $H_1$, $H_2$, and $H_3$ are values which are uniquely determined. $I_z$ denotes the mutual information amount when the variance $\sigma_1^2$ of the LLR is given. Based on the above description, it is possible to compute the equalizer output mutual information amount at the starting point BP and the end point EP of the EXIT chart.

At the starting point BP, the equalizer 201 has not been provided with the LLR as prior information, and thus $s_{soft}$ is "0." In this case, $\delta=0$, and $\Delta=I_K$. Therefore, the equivalent amplitude gain $\mu_z^b$ is, for example, expressed as in Formula 18 by assigning $\Delta=I_K$ to Formula 14.

[Formula 18]

$$\mu_z^b = \frac{1}{K} tr[\Xi^H (\Xi \Xi^H + \sigma^2 I_K)^{-1} \Xi] \quad \text{(FORMULA 18)}$$

The variance $\sigma_1^2$ of the LLR is computed using the equivalent amplitude gain $\mu_z^b$ given by Formulas 18 and 16. The equalizer output mutual information amount $I_z^b$ at the starting point BP is, for example, computed using the variance $\sigma_1^2$ of the LLR and Formula 17.

At the end point EP, in the equalizer 201, $s_{soft}$ is "s" (that is, it is the same as the transmitted signal). In this case, $\delta=1$, and $\Delta=0$. Therefore, the equivalent amplitude gain $\mu_z^e$ is, for example, expressed as in Formula 19 by assigning $\Delta=0$ to Formula 14.

[Formula 19]

$$\mu_z^e = \frac{1}{\sigma^2 K} tr[\Xi^H \Xi] = \frac{1}{\sigma^2 K} \sum_{k=1}^{K} |\Xi(k)|^2 \quad \text{(FORMULA 19)}$$

The variance $\sigma_1^2$ of the LLR is, for example, computed using the equivalent amplitude gain $\mu_z^e$ given by Formulas 19 and 16. The equalizer output mutual information amount $I_z^e$ at the end point EP is, for example, computed using the variance $\sigma_1^2$ of the LLR and Formula 17.

The equalizer output mutual information amounts $I_z^b$ and $I_z^e$ at the starting point BP and the end point EP is, for example, computed by the above-described method. It is possible to obtain the approximation characteristic L31-a shown in FIG. 4 by connecting the starting point BP with the end point EP by the straight line.

Figure 5:
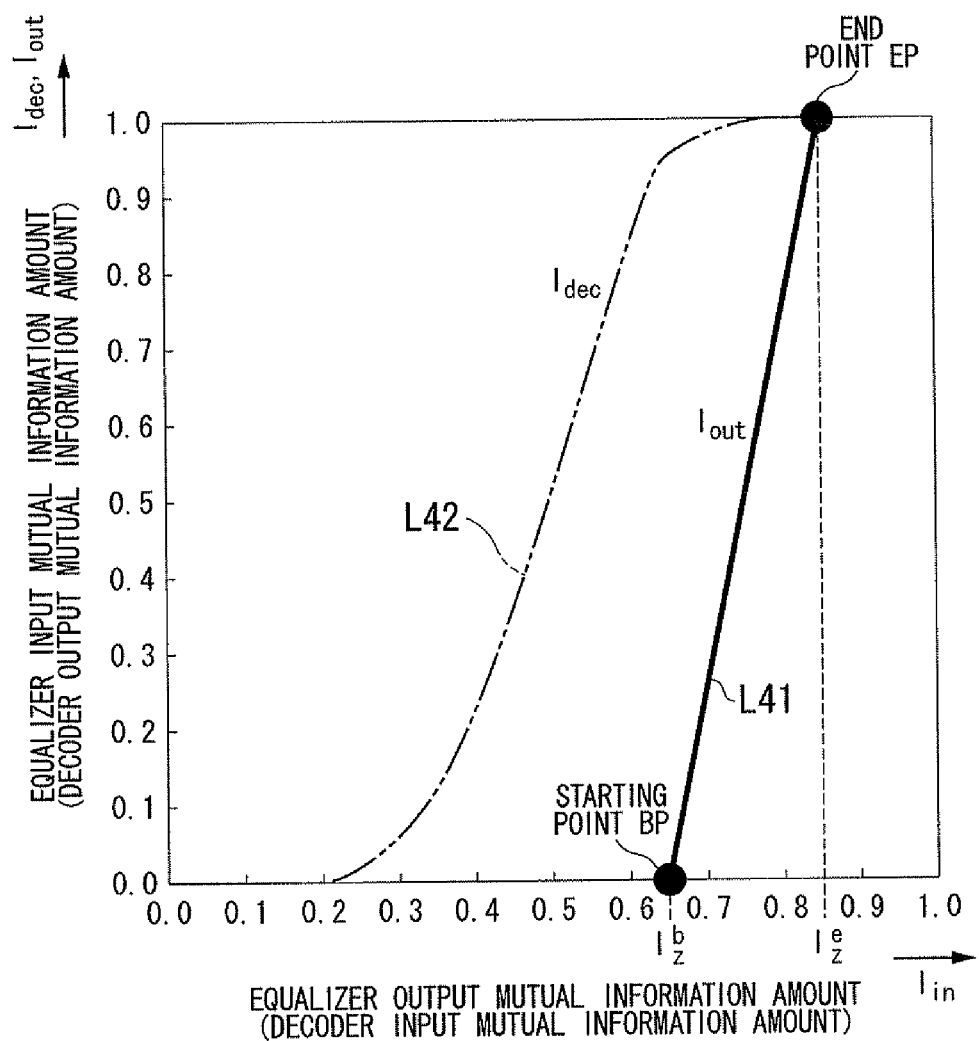
FIG. 5 is an EXIT chart for explaining an execution decision method according to the first embodiment.

Next, an execution decision method for judging whether to execute signal detection by the turbo equalization scheme will be described. FIG. 5 is an EXIT chart for explaining an execution decision method. The EXIT chart illustrated in FIG. 5 is one in which the horizontal axis and the vertical axis of the EXIT chart shown in FIG. 4 are changed. That is, in the EXIT chart, the horizontal axis denotes the equalizer output mutual information amount and the decoder input mutual information amount, and the vertical axis denotes the equalizer input mutual information amount and the decoder output mutual information amount. An approximation characteristic L41 corresponds to the approximation characteristic L31-a shown in FIG. 4, and a decoder I/O characteristic L42 corresponds to the decoder I/O characteristic L32 shown in FIG. 4.

As illustrated in FIG. 5, the occurrence of a stack can be determined by evaluating whether or not the approximation characteristic 41 and the decoder I/O characteristic L42 intersect with each other. When a stack will occur, it can be decided that signal detection by the turbo equalization scheme is not to be executed. Specifically, in FIG. 5, if the I/O characteristic L42 of the decoder 202 is higher than the I/O characteristic L41 as the approximation characteristic of the equalizer 201 during a period of time until the decoder output mutual information amount of the vertical axis becomes "1" from "0," there is no case in which signal detection by turbo equalization scheme generates a stack.

In order to perform such a decision, the approximation I/O characteristic (the approximation characteristic L41) of the equalizer 201 is expressed by a linear function. A slope and an intercept are, for example, expressed as in Formulas 20 and 21, respectively.

[Formula 20]

$$a = \frac{1}{I_z^e - I_z^b} \quad \text{(FORMULA 20)}$$

[Formula 21]

$$b = -\frac{I_z^b}{I_z^e - I_z^b} \quad \text{(FORMULA 21)}$$

a denotes the slope. b denotes the intercept. In this case, an equation of the approximation characteristic L41 is, for example, expressed as in Formula 22.

[Formula 22]

$$I_{out} = \frac{1}{I_z^e - I_z^b} I_{in} - \frac{I_z^b}{I_z^e - I_z^b} \quad \text{(FORMULA 22)}$$

$I_{out}$ denotes the equalizer input mutual information amount, that is, the value of the vertical axis in FIG. 5. $I_{in}$ denotes the equalizer output mutual information amount corresponding to the horizontal axis.

Next, the I/O characteristic of the decoder 202 will be described. Generally, the I/O characteristic of the decoder 202 is, for example, expressed as in Formula 23.

[Formula 23]

$$I_{dec} = (1 - 2^{-H_1 I_{in}^{2H_2}})^{H_3} \quad \text{(FORMULA 23)}$$

In Formula 23, $I_{dec}$ denotes the decoder output mutual information amount, that is, a value of the vertical axis shown in FIG. 5. $I_{in}$ denotes the decoder input mutual information amount corresponding to the horizontal axis. Further, in Formula 23, the values of $H_1$, $H_2$, and $H_3$ are parameters which change with a coding scheme and a coding rate. For example, in the case of convolution coding in which the constraint length is 4 and the coding rate is 1/2, $H_1$=13.8206, $H_2$=3.2731, and $H_3$=1.5506.

A decision can be made as to whether to execute signal detection by evaluating the equalizer I/O characteristic and the decoder I/O characteristic based on Formulas 22 and 23 when the value of $I_{in}$ is between "0" and $I_z^e$. If it is evaluated that $I_{dec}$ computed by Formula 23 is always great, the signal can be completely detected in the signal detection process.

Figures 6, 7:
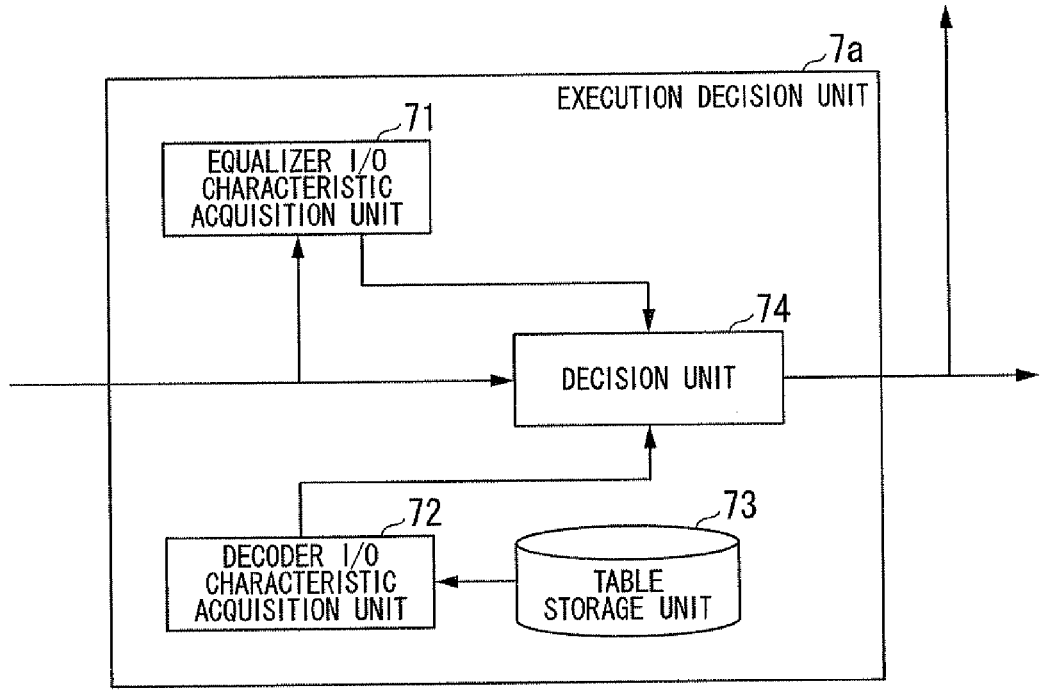
FIG. 6 is a schematic block diagram illustrating a functional block of the execution decision unit according to the first embodiment.
FIG. 7 shows an example of an LUT stored in a storage unit.

The execution decision unit 7a decides whether to execute signal detection based on the above-described principle. Next, a configuration of the execution decision unit 7a will be described in detail. FIG. 6 is a schematic block diagram illustrating a functional block of the execution decision unit 7a. The execution decision unit 7a includes an equalizer I/O characteristic acquisition unit 71, a decoder I/O characteristic acquisition unit 72, a storage unit 73, and a decision unit 74. The functional units included in the execution decision unit 7a will now be described.

The equalizer I/O characteristic acquisition unit 71 acquires an I/O characteristic of the equalizer 201 of the receiving apparatus 100a. First, the equalizer I/O characteristic acquisition unit 71 computes the equalizer output mutual information amounts $I_z^b$ and $I_z^e$ of the starting point BP and the end point EP of the EXIT chart based on the above-described principle. Next, the equalizer I/O characteristic acquisition unit 71 acquires an equation of the approximation characteristic L41 based on the two values.

The decoder I/O characteristic acquisition unit 72 acquires an I/O characteristic of the decoder 202 of the receiving apparatus 100a. As described above, it is possible to acquire the I/O characteristic of the decoder 202 in advance. Therefore, the decoder I/O characteristic acquisition unit 72 acquires the I/O characteristic of the decoder 202 by reading out the I/O characteristic stored in the storage unit 73.

The storage unit 73 stores the I/O characteristic of the decoder 202 of the receiving apparatus 100a. The storage unit 73 may store a formula (corresponding to Formula 23) illustrating the I/O characteristic of the decoder 202. Further, the storage unit 73 may store a look up table (LUT) in which an input value and an output value are matched with each other as the I/O characteristic of the decoder 202. FIG. 7 shows an example of an LUT stored in the storage unit 73. In FIG. 7, the LUT has a value $I_{in}$ of the input mutual information amount from "0" to "1" at an interval of 0.1, and each input mutual information amount is matched with the output mutual information amount ($I_{dec}$). FIG. 7 illustrates a case of convolution coding in which the constraint length is 4, and the coding rate is 1/2.

Since the storage unit 73 stores the LUT, it is possible to reduce the processing time required when the decoder I/O characteristic acquisition unit 72 acquires the output mutual information amount corresponding to each input mutual information amount. A formula (Formula 23) representing the I/O characteristic of the decoder 202 has an exponent, and thus it takes time to perform a process of acquiring the output mutual information amount based on this formula. Therefore, it is effective to use the LUT. Further, a configuration of the LUT stored in the storage unit 73 is not limited to the table illustrated in FIG. 7.

The decision unit 74 decides whether to execute a signal detection process by the equalizer 201 and the decoder 202 based on the equalizer I/O characteristic acquired by the equalizer I/O characteristic acquisition unit 71 and the decoder I/O characteristic acquired by the decoder I/O characteristic acquisition unit 72.

A process in the decision unit 74 will be described in connection with whether or not there is an occurrence of a stack. The decision unit 74 evaluates whether or not there is an occurrence of a stack based on the I/O characteristic acquired by the equalizer I/O characteristic acquisition unit 71 and the I/O characteristic acquired by the decoder I/O characteristic acquisition unit 72. If it is evaluated that the stack will not occur, the decision unit 74 decides that the signal detection process is to be executed. However, if it is evaluated that the stack will occur, the decision unit decides that the signal detection process is not to be executed. A process of evaluating whether or not there is an occurrence of a stack based on the both I/O characteristics is realized, for example, by the following method.

Next, a process in the decision unit 74 will be described in connection with whether or not the approximation characteristic L41 of the equalizer 201 and the I/O characteristic L42 of the decoder 202 intersect in the EXIT chart. The decision unit 74 evaluates whether or not the two I/O characteristics intersect in the EXIT chart based on the I/O characteristic acquired by the equalizer I/O characteristic acquisition unit 71 and the I/O characteristic acquired by the decoder I/O characteristic acquisition unit 72. If it is evaluated that the input characteristics do not intersect, the decision unit 74 evaluates that the stack will not occur. However, if it is evaluated that both of the input characteristics intersect, the decision unit 74 evaluates that the stack will occur. Therefore, if it is evaluated that the I/O characteristics do not intersect, the decision unit 74 decides that the signal detection process is to be executed. However, if it is evaluated that the two I/O characteristics intersect, the decision unit 74 decides that the signal detection process is not to be executed. This is because when the two I/O characteristics intersect, there is a possibility for an error to occur in signal detection even if a signal detection process was executed.

Next, a concrete process of implementing the evaluation will be described. The decision unit 74 acquires values of $I_{out}$ and $I_{dec}$ corresponding to a plurality of values of $I_{in}$. When the value of $I_{out}$ is smaller than the value of $I_{dec}$ for each value of $I_{in}$, the decision unit 74 evaluates that the I/O characteristics do not intersect. The decision unit 74 uses a plurality of values between 0 and $I_z^e$ as a plurality of values of $I_{in}$ used in the evaluation. The decision unit 74 uses "0" as a minimum value of $I_{in}$. The decision unit 74 also uses $I_z^e$ as a maximum value of $I_{in}$. The values of $I_{out}$ and $I_{dec}$ corresponding to each value of $I_{in}$ are acquired by the equalizer I/O characteristic acquisition unit 71 and the decoder I/O characteristic acquisition unit 72, respectively, and transmitted to the decision unit 74.

For example, the decision unit 74 sets the value of $I_{in}$ from 0 to $I_z^e$ at an interval of 0.1 to perform the evaluation. When it is desired to evaluate in further detail, the interval width may be set smaller. On the other hand, when it is desired to roughly evaluate to reduce a processing time required for the evaluation, the interval width may be set greater.

The equalizer 201 and the decoder 202 of the receiving apparatus 100a execute a signal detection process depending on the decision of the execution decision unit 7a.

Figure 8:
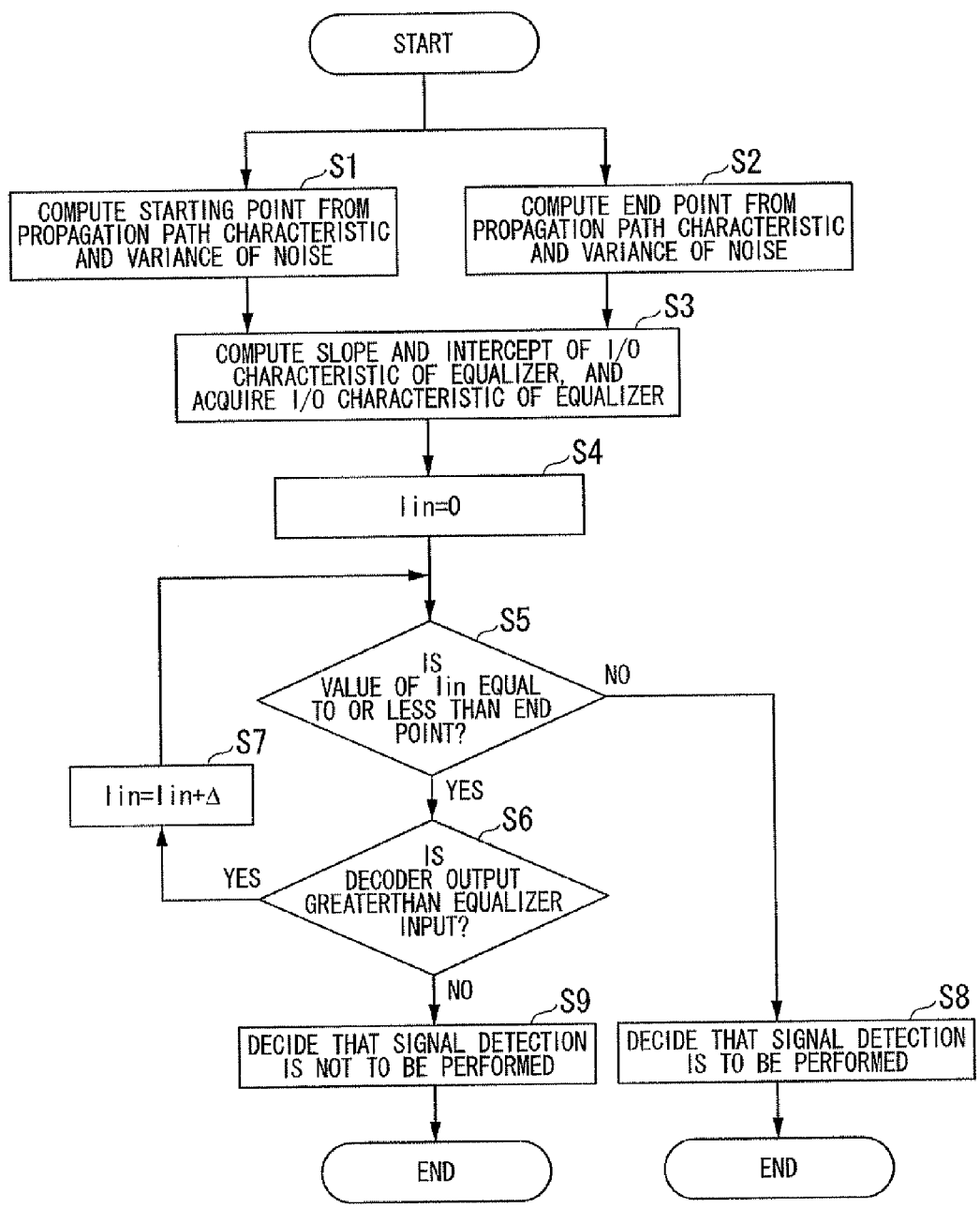
FIG. 8 is a flowchart illustrating a process in the execution decision unit according to the first embodiment.

FIG. 8 is a flowchart illustrating a process executed by the execution decision unit 7a. The flow of the process executed by the execution decision unit 7a will now be described with reference to FIG. 8.

First, the equalizer I/O characteristic acquisition unit 71 computes and acquires the equalizer output mutual information amounts at the starting point BP and the end point EP based on the propagation path characteristic and the variance of noise (S1 and S2). The equalizer I/O characteristic acquisition unit 71 acquires the slope and the intercept of the approximation characteristic L41 based on the equalizer output mutual information amounts at the starting point BP and the end point EP and obtains the I/O characteristic of the equalizer 201 (S3).

Next, the decision unit 74 assigns an initial value "0" as the value of $I_{in}$ (S4). The equalizer I/O characteristic acquisition unit 71 and the decoder I/O characteristic acquisition unit 72 acquire the value of $I_{out}$ and the value of $I_{dec}$ and transmit the values to the decision unit 74. When the value of $I_{out}$ is less than or equal to the value of $I_{dec}$ (S6-NO), the decision unit 74 decides that signal detection through a repetition process is not to be executed (S9).

However, when the value of $I_{dec}$ is greater than the value of $I_{out}$ (S6-YES), the decision unit 74 adds a predetermined value $\Delta$ to the value of $I_{in}$ to acquire a new value of $I_{in}$ (S7). When the new value of $I_{in}$ is less than or equal to the equalizer output mutual information amount $I_z^e$ of the end point EP acquired by the equalizer I/O characteristic acquisition unit 71 (S5-YES), the decision unit 74 executes a process subsequent to S6. However, when the new value of $I_{in}$ is greater than the equalizer output mutual information amount $I_z^e$ (S5-NO), the decision unit 74 decides that signal detection through a repetition process is to be executed (S8).

The receiving apparatus 100a configured as described above controls execution of signal detection by the equalizer 201 and the decoder 202 based on the decision of the execution decision unit 7a. When the execution decision unit 7a evaluates that the stack will occur (that is, when it evaluates that signal detection is not to be executed), since a repetition process for signal detection is useless, the receiving apparatus 100a does not execute signal detection. However, when the execution decision unit 7a evaluates that the stack will not occur (that is, when it evaluates that signal detection is to be executed), since a repetition process for signal detection is not useless, the receiving apparatus 100a executes signal detection. Therefore, it is possible to prevent the signal detection accuracy from deteriorating and reduce the number of times a repetition process is executed. As a result, it is possible to reduce time and power consumption required for it as much as the number of times a repetition process is executed is reduced. Further, for the problem in that a useless repetition process in which a stack occurs was executed, it is possible to prevent such a useless repetition process from being executed through the process in the execution decision unit 7a.

Variant of First Embodiment

When the equalizer I/O characteristic and the decoder I/O characteristic are evaluated based on Formulas 22 and 23, it is possible to decide whether to execute signal detection even by performing evaluation with the value of $I_{in}$ being between $I_z^b$ and $I_z^e$. If it is evaluated that $I_{dec}$ computed by Formula 23 is always greater, a signal can be completely detected in a signal detection process.

Based on such a principle, the execution decision unit 7a may decide whether to execute signal detection by evaluating when the value of $I_{in}$ is between $I_z^b$ and $I_z^e$. In this case, in a process of acquiring and comparing the values of $I_{out}$ and the values of $I_{dec}$ corresponding to a plurality of values of $I_{in}$, the decision unit 74 uses a plurality of values between $I_z^b$ and $I_z^e$ as a plurality of values of $I_{in}$. The decision unit 74 uses $I_z^b$ as a minimum value of $I_{in}$. The decision unit 74 also uses $I_z^e$ as a maximum value of $I_{in}$. In this case, a difference between the maximum value and the minimum value of $I_{in}$ is reduced. Therefore, a difference between the values of $I_{in}$ (0.1 in the above-described embodiment) may be set smaller than in the case of using "0" as the minimum value of $I_{in}$.

Further, in the above-described embodiment, the decision unit 74 decides that the signal detection process is not to be executed when the approximation characteristic L41 of the equalizer 201 and the I/O characteristic L42 of the decoder 202 intersect in the EXIT chart. However, even when the two I/O characteristics intersect in the EXIT chart, when the value of the decoder output mutual information amount at the intersection point is greater than or equal to a predetermined value (for example, 0.99), the decision unit 74 may decide that the signal detection process is to be executed. Specifically, the decision unit 74 acquires and compares the values of $I_{out}$ and the values of $I_{dec}$ corresponding to a plurality of values of $I_{in}$. When the value of $I_{dec}$ is less than or equal to the value of $I_{out}$ (S6-NO in FIG. 8), the decision unit 74 decides whether or not the value of $I_{dec}$ is greater than a predetermined value. If the value of $I_{dec}$ is greater than or equal to the predetermined value, the decision unit 74 decides that the signal detection process is to be executed (S8 in FIG. 8). However, if the value of $I_{dec}$ is smaller than the predetermined value, it is decided that the signal detection process is not to be executed (S9 in FIG. 8).

Second Embodiment

Next, a receiving apparatus 100b according to a second embodiment will be described. The receiving apparatus 100b is different from the receiving apparatus 100a in that an execution decision unit 7b is disposed instead of the execution decision unit 7a, but is the same in other configurations as the receiving apparatus 100a. That is, configurations of a receiving antenna 1, a radio unit 2, a pilot separation unit 3, a propagation path characteristic/variance estimation unit 4, a CP removal unit 5, an FFT unit 6, a soft cancellation unit 8, an equalization unit 9, a demodulation unit 10, a de-interleaver 11, a decoding unit 12, an interleaver 13, a soft replica generation unit 14, and a propagation path characteristic multiplying unit 15 in the receiving apparatus 100b are the same as in the above-described receiving apparatus 100a. Therefore, the entire receiving apparatus 100b will not be described, but only the execution decision unit 7b.

Figure 9:
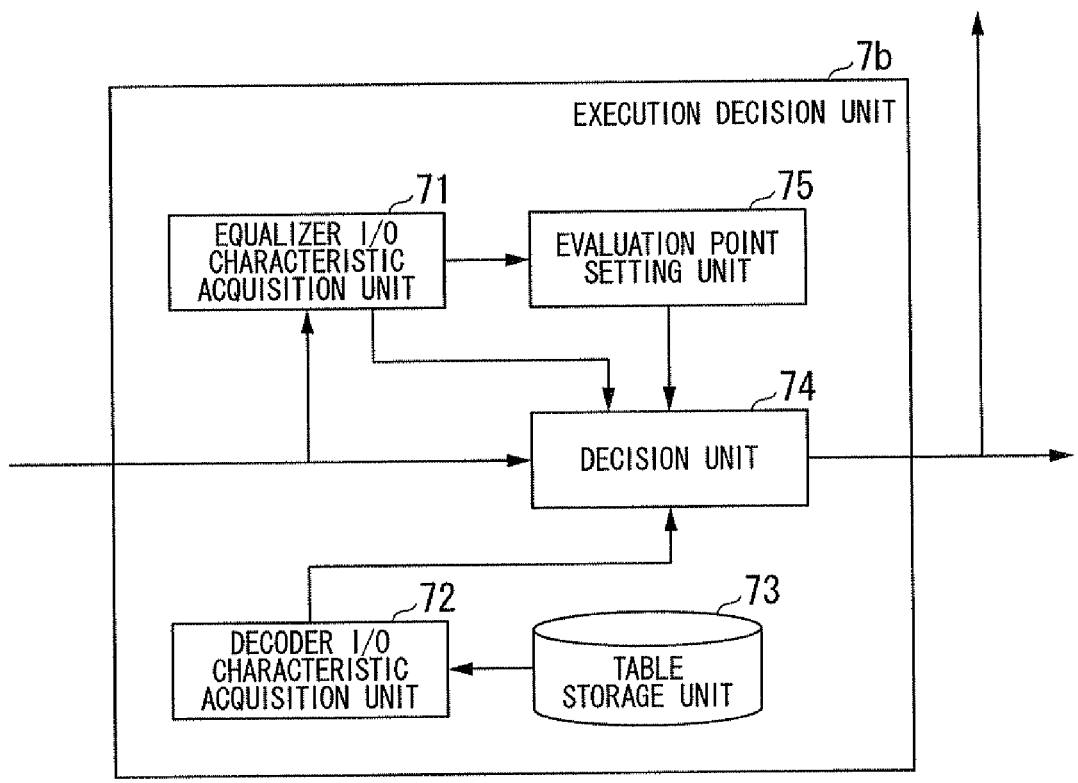
FIG. 9 is a schematic block diagram illustrating a functional configuration of an execution decision unit according to a second embodiment.

FIG. 9 is a schematic block diagram illustrating a functional configuration of the execution decision unit 7b. The execution decision unit 7b is different from the execution decision unit 7a in that it further includes an evaluation point setting unit 75. The differences of the execution decision unit 7b from the execution decision unit 7a will now be mainly described.

The evaluation point setting unit 75 determines a plurality of values of $I_{in}$, which are used by the decision unit 74 in evaluating the I/O characteristic, based on the I/O characteristic of the equalizer 201. Specifically, the evaluation point setting unit 75 sets a difference (a value of Δ in the process S7 in FIG. 8) between the values of $I_{in}$. As the equalizer output mutual information amount $I_z^e$ at the end point EP is smaller, the evaluation point setting unit 75 sets the value of Δ smaller. The evaluation point setting unit 75 transmits the set value of Δ to the decision unit 74. The decision unit 74 performs the process using the value of Δ set by the evaluation point setting unit 75.

If the equalizer output mutual information amount $I_z^e$ at the end point EP is small, it means that signal receiving quality is bad. Therefore, as the value decreases, the possibility that a stack will occur is higher, and a more rigorous evaluation is required. In the receiving apparatus 100b, the evaluation point setting unit 75 sets the value of Δ based on the value of the equalizer output mutual information amount $I_z^e$. Therefore, as the possibility that a stack will occur increases, the decision unit 74 performs the evaluation for $I_{in}$ with the smaller width, thereby improving accuracy of the decision of the decision unit 74.

Third Embodiment

Figure 10:
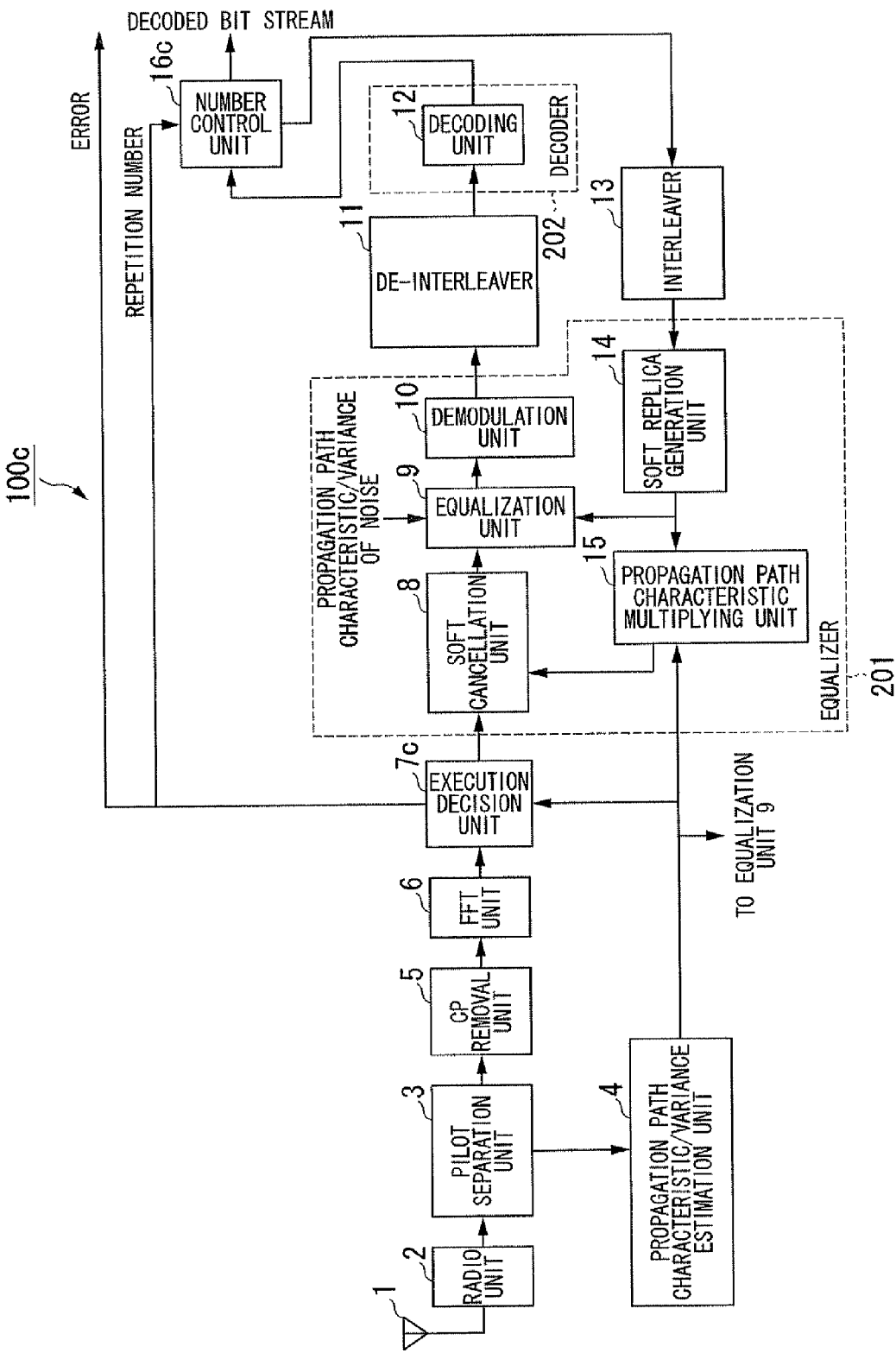
FIG. 10 is a schematic block diagram illustrating a functional configuration of a receiving apparatus according to a third embodiment.

Next, a receiving apparatus 100c according to a third embodiment will be described. FIG. 10 is a schematic block diagram illustrating a functional configuration of the receiving apparatus 100c. The receiving apparatus 100c is different from the receiving apparatus 100a in that an execution decision unit 7c is included instead of the execution decision unit 7a. The receiving apparatus 100c is also different from the receiving apparatus 100a in that a number control unit 16c is further included between the decoding unit 12 and the interleaver 13. The receiving apparatus 100c is the same in other configurations as the receiving apparatus 100a. That is, configurations of a receiving antenna 1, a radio unit 2, a pilot separation unit 3, a propagation path characteristic/variance estimation unit 4, a CP removal unit 5, an FFT unit 6, a soft cancellation unit 8, an equalization unit 9, a demodulation unit 10, a de-interleaver 11, a decoding unit 12, an interleaver 13, a soft replica generation unit 14, and a propagation path characteristic multiplying unit 15 in the receiving apparatus 100c are the same as in the above-described receiving apparatus 100a. Therefore, differences of the receiving apparatus 100c from the receiving apparatus 100a will be mainly described.

The execution decision unit 7c decides whether to execute signal detection through a repetition process. When it is decided that the signal detection is to be executed, the execution decision unit 7c further determines the repetition number. When the execution number is determined, the execution decision unit 7c transmits the execution number to the number control unit 16c. When it is decided that the signal detection through a repetition process is not to be executed, the execution decision unit 7c may transmit "0" as the repetition number to the number control unit 16c.

The number control unit 16c controls the repetition number of the repetition process according to the repetition number received from the execution decision unit 7c. If the repetition number is satisfied in the repetition process performed by the equalizer 201 and the decoder 202, the number control unit 16c transmits a signal output from the decoder 202 not to the interleaver 13 but to another function unit for processing a received data signal.

Figure 11:
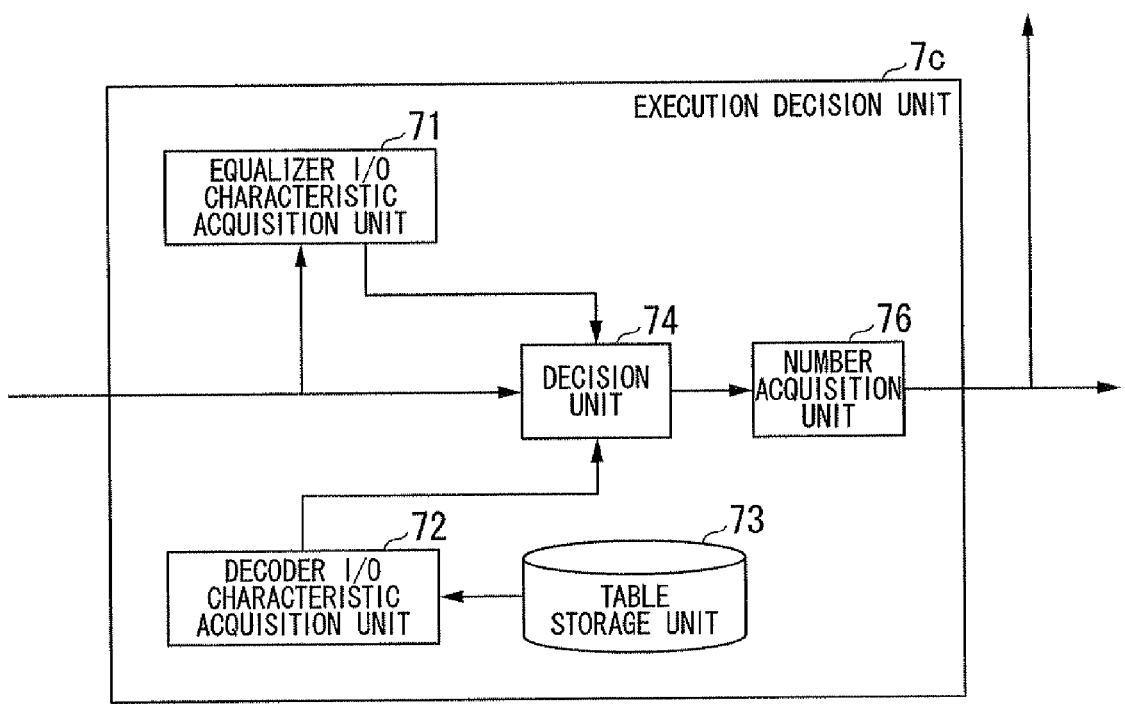
FIG. 11 is a schematic block diagram illustrating a functional configuration of an execution decision unit according to the third embodiment.

Next, details of the execution decision unit 7c will be described. FIG. 11 is a schematic block diagram illustrating a functional configuration of the execution decision unit 7c. The execution decision unit 7c is different from the execution decision unit 7a in that the execution decision unit 7c further includes a number acquisition unit 76. The differences of the execution decision unit 7c from the execution decision unit 7a will be mainly described.

Figure 12:
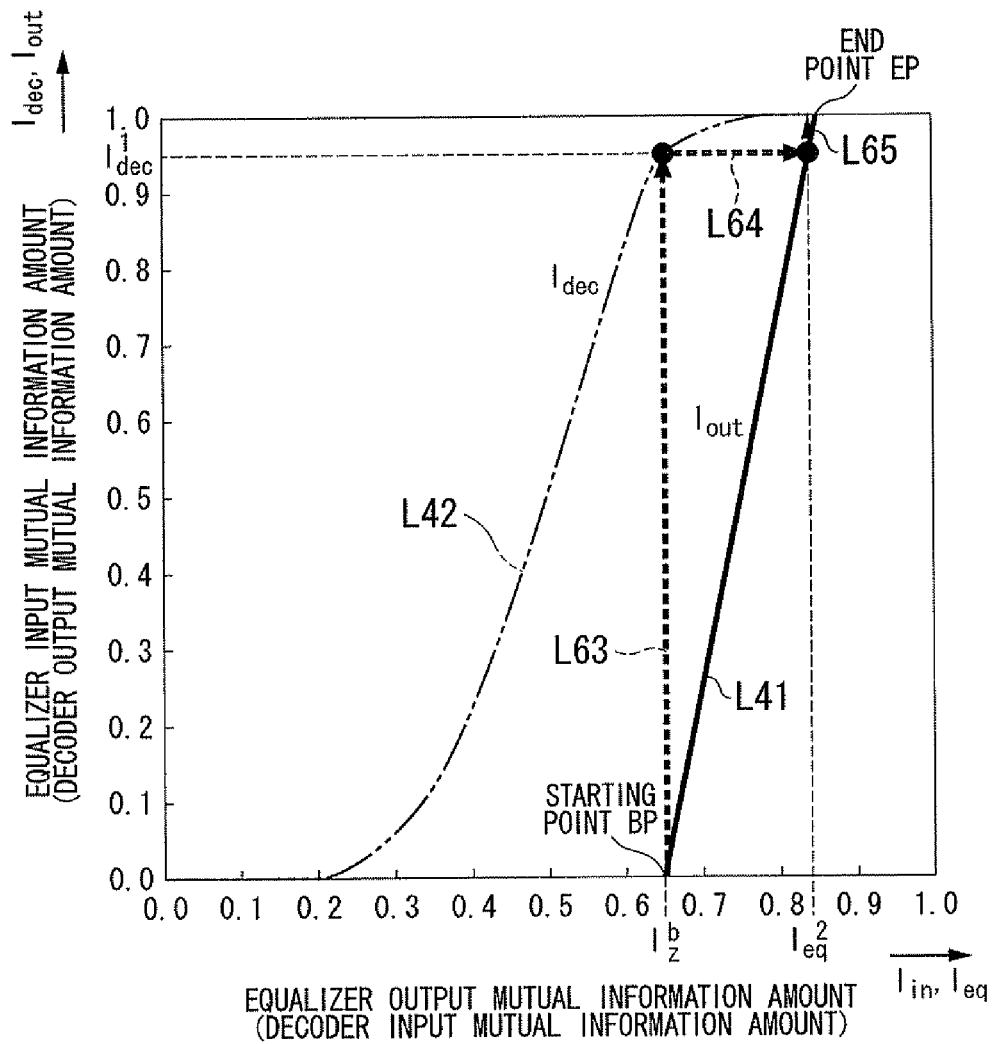
FIG. 12 is an EXIT chart for explaining a method of determining a repetition number.

First, a principle of a method of determining the repetition number will be described. FIG. 12 is an EXIT chart illustrating a method of determining the repetition number. The I/O characteristic of the EXIT chart illustrated in FIG. 12 is the same as that in FIG. 5. FIG. 12 additionally shows an EXIT locus indicating an improvement of the mutual information amount, unlike FIG. 5.

In FIG. 12, an arrow L63 denotes an EXIT locus indicating an improvement of reliability by a decoding process in a first repetition. An arrow L64 denotes an EXIT locus indicating an improvement of reliability by an equalization process in a second repetition. An arrow L65 denotes an EXIT locus indicating an improvement of reliability by a decoding process in the second repetition. In FIG. 12, an improvement of reliability by an equalization process in the first repetition is an EXIT locus from the origin to a starting point BP. However, since the starting point BP and the end point EP are computed by the equalizer I/O characteristic acquisition unit 71, this EXIT locus is not shown in FIG. 12.

A decoder output mutual information amount obtained by a decoding process such as the arrow L63 and the arrow L65 are, for example, expressed as in Formula 24.

[Formula 24]

$$I_{dec} = (1 - 2^{-H_1 I_{in}^{2H_2}})^{H_3} \quad \text{(FORMULA 24)}$$

In Formula 24, $H_1$, $H_2$, and $H_3$ are parameters which change with a coding scheme and a coding rate. For example, in the case of convolution coding in which the constraint length is 4 and the coding rate is 1/2, $H_1$=13.8206, $H_2$=3.2731, and $H_3$=1.5506. Further, $I_{in}$ denotes a decoder input mutual information amount expressed by a real number from 0 to 1. Further, $I_{dec}$ denotes a decoder output mutual information amount expressed by a real number from 0 to 1.

An equalizer output mutual information amount obtained by an equalization process such as the arrow L64 is, for example, expressed as in Formula 25. Formula 25 is obtained by assigning the decoder output mutual information amount $I_{dec}$ to $I_{out}$ of Formula 22.

[Formula 25]

$$I_{eq} = (I_z^e - I_z^b) I_{in} + I_z^b \quad \text{(FORMULA 25)}$$

In Formula 25, $I_{eq}$ denotes the equalizer output mutual information amount expressed by a real number from 0 to 1.

It is possible to obtain a decoder output mutual information amount $I_{dec}^1$ in a first repetition by assigning the decoder input mutual information amount $I_{zb}$ of the starting point BP to $I_{in}$ of Formula 24 (arrow L63). The decoder output mutual information amount $I_{dec}^1$ is, for example, used as the equalization input mutual information amount in a second repetition process.

In Formula 25, it is possible to obtain an equalizer output mutual information amount $I_{eq}^2$ in a second repetition by assigning $I_{dec}^1$ obtained from L63 to $I_{in}$. It is possible to obtain a decoder output mutual information amount in a second repetition by assigning $I_{eq}^2$ to $I_{in}$ of Formula 24. Such a process using Formula 24 and Formula 25 is repeated until the value of the decoder output mutual information amount becomes about 1 (for example, 0.99). Therefore, it is possible to acquire this repetition number as the repetition number of the repetition process in the equalizer 201 and the decoder 202. Further, it can be empirically understood that it is possible to detect without an error if a desired value of the decoder output mutual information amount is greater than or equal to 0.99. However, this value is a design item, and another value such as 0.999 may be applied.

The number acquisition unit 76 acquires the repetition number based on the above-described principle. That is, the number acquisition unit 76 acquires the equalizer I/O characteristic and the decoder I/O characteristic through the decision unit 74. Similarly, the number acquisition unit 76 acquires the decoder input mutual information amount $I_z^b$ of the starting point BP. The number acquisition unit 76 repeats a process using Formulas 24 and 25 described above and counts the repetition number. The number acquisition unit 76 acquires the count number when the value of the decoder output mutual information amount exceeds a threshold (for example, 0.99 or 0.999), as the repetition number.

Figure 13:
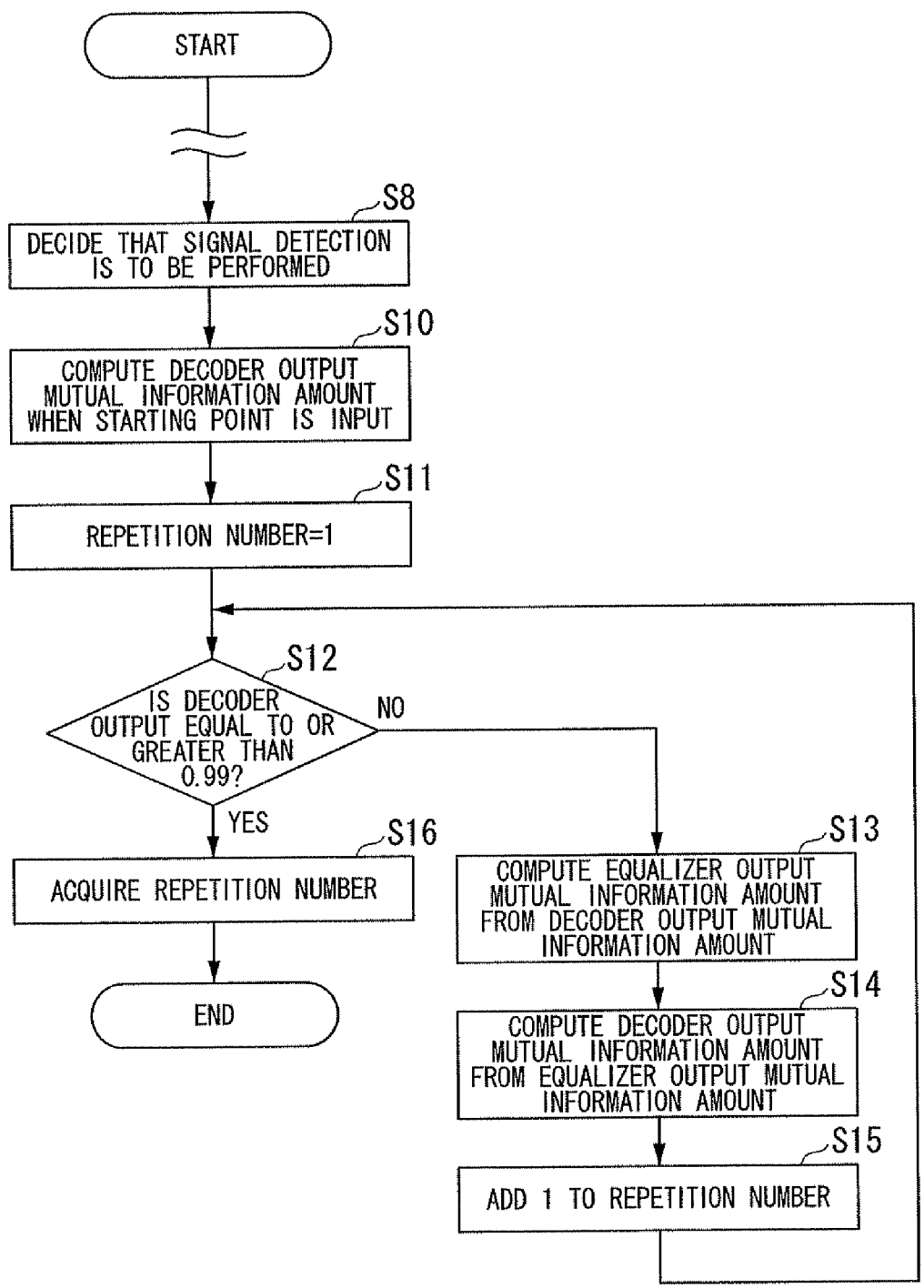
FIG. 13 is a flowchart illustrating a process in the execution decision unit according to the third embodiment.

FIG. 13 is a flowchart illustrating a process executed by the execution decision unit 7c. The flow of a process executed by the execution decision unit 7c will now be described with reference to FIG. 13. Processes from the starting to S8 and a process of S9, which is not shown, are the same as the process in the execution decision unit 7a of the first embodiment illustrated in FIG. 8, and thus a description thereof will be omitted.

In the process of S8, when the decision unit 74 decides that signal detection is to be executed, the number acquisition unit 76 computes the decoder output mutual information amount in a first decoding process (S10). The number acquisition unit 76 prepares a counter for counting the repetition number and inputs "1" to the counter (S11). Next, when the computed decoder output mutual information amount does not exceed a threshold (S12-NO), the number acquisition unit 76 computes the equalizer output mutual information amount using the computed decoder output mutual information amount (S13). The number acquisition unit 76 then computes the decoder output mutual information amount using the computed equalizer output mutual information amount (S14). The number acquisition unit 76 then adds "1" to the repetition number counter (S15) and returns to a branch of S12 again.

On the other hand, when the computed decoder output mutual information amount exceeds the threshold (S12-YES), the number acquisition unit 76 acquires the counter value at this time as the repetition number (S16).

In the receiving apparatus 100c configured as described above, the number control unit 16c controls the repetition number of the repetition process performed by the equalizer 201 and the decoder 202 based on the decision of the execution decision unit 7c. Specifically, the execution decision unit 7c acquires the number of times necessary for signal detection, and the number control unit 16c performs control so that the repetition process is performed that number of times. Accordingly, when performing the signal detection through a repetition process, it is possible to prevent useless repetition from being performed. Therefore, it is possible to prevent the signal detection accuracy from deteriorating and reduce the execution number of the repetition process. As a result, it is possible to reduce time and power consumption required for the repetition process.

Variant of Third Embodiment

The number acquisition unit 76 may add a predetermined value (for example, 1 or 2) to the acquired number and transmit the repetition number to the number control unit 16c. The addition may be performed by the number control unit 16c. Since the equalizer I/O characteristic used for the process by the number acquisition unit 76 is originally an approximated straight line, there is a possibility that an error exists in the acquired number. Therefore, the repetition number is set extra in consideration of the error, thereby improving the accuracy of the signal detection through the repetition process.

Fourth Embodiment

Next, a receiving apparatus according to a fourth embodiment will be described. The receiving apparatus 100d is different from the receiving apparatus 100c in that an execution decision unit 7d is disposed instead of the execution decision unit 7c, and is the same in other considerations as the receiving apparatus 100c. That is, configurations of a receiving antenna 1, a radio unit 2, a pilot separation unit 3, a propagation path characteristic/variance estimation unit 4, a CP removal unit 5, an FFT unit 6, a soft cancellation unit 8, an equalization unit 9, a demodulation unit 10, a de-interleaver 11, a decoding unit 12, an interleaver 13, a soft replica generation unit 14, a propagation path characteristic multiplying unit 15, and a number control unit 16c in the receiving apparatus 100d are the same as in the above-described receiving apparatus 100d. Therefore, the whole receiving apparatus 100d will not be described, but only the execution decision unit 7d. In the receiving apparatus 100d, the repetition number (N) of a repetition process by the equalizer 201 and the decoder 202 is determined in advance.

The execution decision unit 7d is different from the execution decision unit 7c in that it includes a number acquisition unit 76d instead of the number acquisition unit 76c, and is the same in other configurations as the execution decision unit 7c. Therefore, the number acquisition unit 76d will be described, and description of other configurations of the execution decision unit 7d will be omitted.

The number acquisition unit 76d decides that signal detection through the repetition process is not to be executed when the counter value exceeds the value of N described above.

Figure 14:
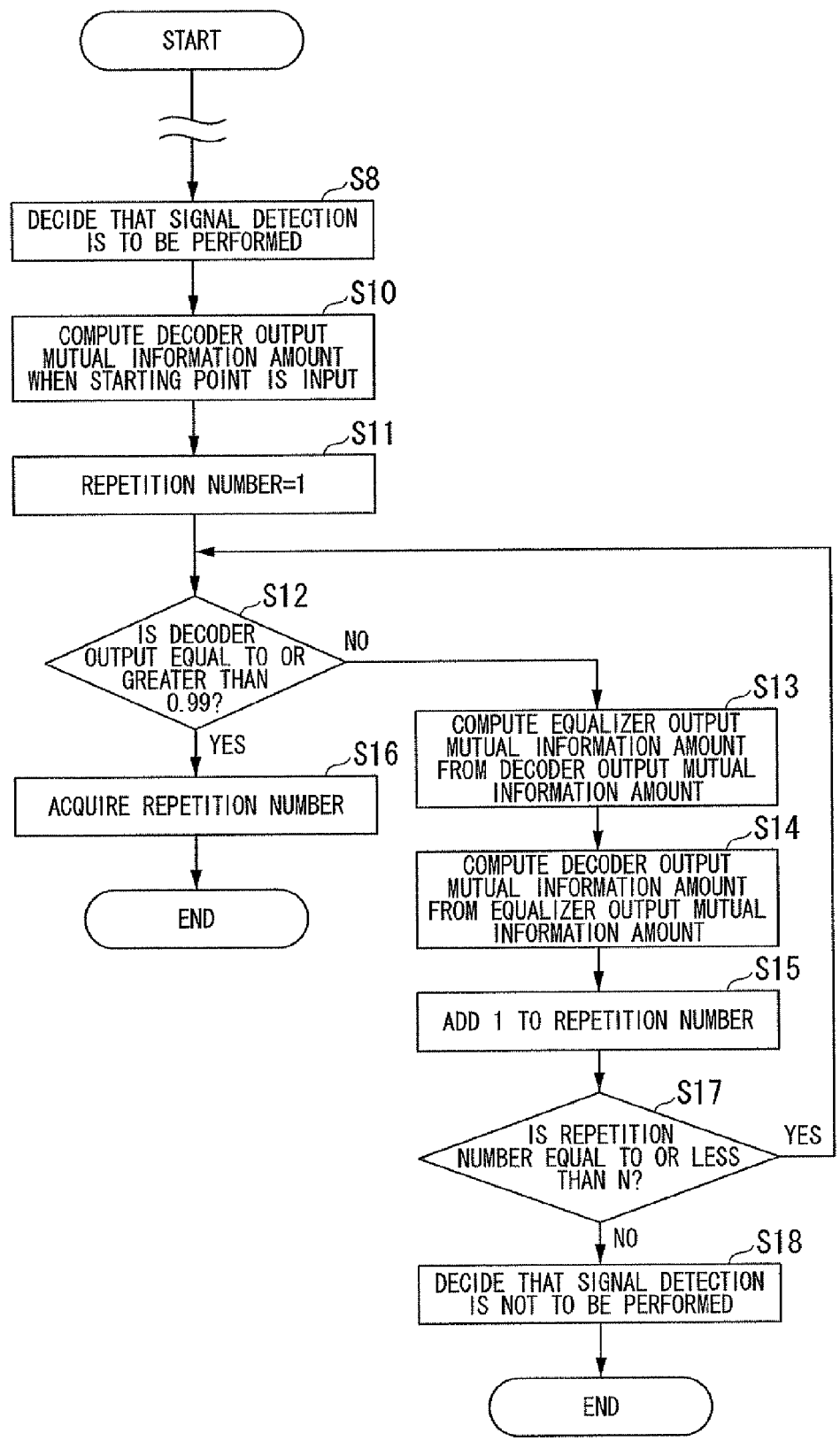
FIG. 14 is a flowchart illustrating a process in an execution decision unit according to a fourth embodiment.

FIG. 14 is a flowchart illustrating a process executed by the execution decision unit 7d. The flow of a process executed by the execution decision unit 7d will now be described with reference to FIG. 14. Processes from the starting to S8 and a process of S9, which is not shown, are the same as in the execution decision unit 7a of the first embodiment illustrated in FIG. 8, and thus a description thereof will be omitted. Further, processes which are the same as in FIG. 13 are referred to by the same reference numerals, and a description thereof will be omitted.

In FIG. 14, after the process of S15, when the counter value is less than or equal to N (S17-YES), the number acquisition unit 76d returns to a branch of S12. However, when the counter value is greater than N (S17-NO), the number acquisition unit 76d decides that signal detection through the repetition process is not to be executed (S18) and then terminates the process.

The branch based on whether or not the counter number is less than or equal to N is disposed after the process of S15 in FIG. 14 but may be disposed between S12 and S15.

When the repetition number, quality such as a data real-time characteristic is determined in advance for convenience, the modulation scheme and the coding rate may be changed.

Figure 15:
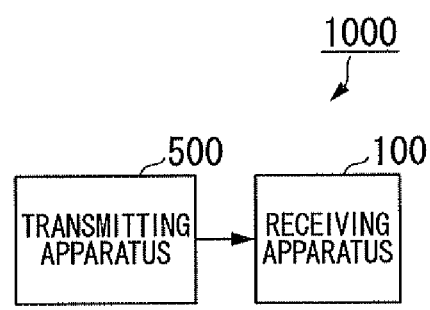
FIG. 15 shows a configuration of a radio communication system.

Next, a radio communication system 100 will be described. FIG. 15 shows a configuration of the radio communication system 100. The radio communication system 1000 includes a receiving apparatus 100 and a transmitting apparatus 500. The transmitting apparatus 500 is the well-known transmitting apparatus illustrated in FIG. 16. The receiving apparatus 100 is any of the receiving apparatuses 100a to 100d according to the embodiments described above. As described above, the transmitting apparatus 500 executes error correction coding for transmission data (transmission bit stream) or interleaves the sequence of the bit stream and transmits a signal. The receiving apparatus 100 receives the signal transmitted from the transmitting apparatus 500 and executes the above-described process for the received signal to obtain the decoded bit stream.

Further, some or all of the receiving apparatuses 100a to 100d according to the embodiments described above may be configured using dedicated software.

Further, in some of the receiving apparatuses 100a to 100d according to the embodiments described above, for example, the function of the execution decision units 7a to 7d may be realized by a computer. In this case, a program of realizing the execution decision process may be recorded on a computer-readable recording medium, and may be read and executed by the computer system. The "computer system" mentioned above includes an operating system (OS) or hardware such as peripherals. Further, the "computer-readable recording medium" includes a storage unit, including a portable medium such as a flexible disk, a magnetic optical disk, a ROM, and a CD-ROM, and a hard disk embedded in the computer system. Further, the "computer-readable recording medium" may include a medium for temporarily and dynamically storing programs, like a communication line when a program is transmitted via a network such as the Internet or a communication line such as a telephone line, and a medium for storing programs for a predetermined time, like a volatile memory inside a computer system consisting of a server and a client in that case. The program may be a program for realizing some of the above-described functions. Alternatively, the program may be a program capable of realizing the above-described functions through a combination with a program previously stored in a computer system.

The embodiments of the present invention have been described above with reference to the drawings, but the concrete configuration is not limited to the embodiments and also includes designs without departing from the spirit or scope of the invention.

The invention claimed is:

1. An execution decision apparatus which decides whether to execute a detection process for a turbo equalization apparatus which detects data before coding, by repeating processes performed on transmission data coded by error correction coding, by an equalization unit for compensating distortion by a propagation path and a decoding unit for performing an error correction process, the execution decision apparatus comprising:

an equalization unit I/O characteristic acquisition unit which acquires an I/O characteristic of the equalization unit;

a decoding unit I/O characteristic acquisition unit which acquires an I/O characteristic of the decoding unit; and a decision unit which decides whether to execute the detection process in the turbo equalization apparatus based on the I/O characteristics acquired for each of the equalization unit and the decoding unit.

2. The execution decision apparatus according to claim 1, further comprising a table storage unit which stores a table including a correspondence between a plurality of input values and output values for the respective input values with respect to the input characteristic of the decoding unit, wherein the decoding unit input characteristic acquisition unit acquires an input characteristic by reading content of the table from the table storage unit.

3. A receiving apparatus comprising the execution decision apparatus according to claim 1.

4. The execution decision apparatus according to claim 1, further comprising a number acquisition unit which acquires a repetition number for a repetition process in the turbo equalization apparatus based on an input characteristic of the equalization unit and an input characteristic of the decoding unit.

5. The execution decision apparatus according to claim 4, wherein the turbo equalization apparatus has a maximum value of the number of times the repetition process is executed, in advance, and the number acquisition unit decides that the detection process is not to be executed when an acquired repetition number exceeds the maximum value of the number of times the repetition process is executed in the turbo equalization apparatus.

6. The execution decision apparatus according to claim 1, wherein the decision unit evaluates whether or not a stack will occur when the detection process is repeated in the turbo equalization apparatus, based on the I/O characteristics acquired for each of the equalization unit and the decoding unit, decides that the detection process is not to be performed when it is evaluated that the stack will occur, and decides that the detection process is to be performed when it is evaluated that the stack will not occur.

7. The execution decision apparatus according to claim 6, wherein the equalization unit I/O characteristic acquisition unit acquires an I/O characteristic related to a mutual information amount of the equalization unit, the decoding unit I/O characteristic acquisition unit acquires an I/O characteristic related to a mutual information amount of the decoding unit, and the decision unit evaluates that the stack will occur and decides that the detection process is not to be executed when the two I/O characteristics intersect, and evaluates that the stack will not occur and decides that the detection process is to be executed when the two I/O characteristics do not intersect.

8. The execution decision apparatus according to claim 7, wherein the equalization unit I/O characteristic unit acquires the I/O characteristic of the equalization unit by acquiring an output mutual information amount when an input mutual information amount of the equalization unit is zero and an output mutual information amount when the input mutual information amount is "1," and performing approximation using values of the two output mutual information amounts.

9. The execution decision apparatus according to claim 7, wherein the decision unit compares relative sizes of respective output values at a plurality of evaluation points based on the two I/O characteristics, and evaluates that the two I/O characteristics do not intersect when magnitude relations of the relative sizes of all the evaluation points are identical.

10. The execution decision apparatus according to claim 9, further comprising an evaluation point setting unit which sets values of the plurality of evaluation points by setting an interval between the plurality of evaluation points based on the I/O characteristic of the equalization unit.

11. A radio communication system, comprising:
a transmitting apparatus comprising a coding unit which performs coding by error correction code on data and a transmitting unit which transmits the data coded by the coding unit; and
a receiving apparatus comprising a receiving unit which receives data transmitted by the transmitting apparatus, a turbo equalization unit which detects data before coding by repeating processes performed on the data received by the receiving unit, by an equalization unit which compensates distortion by a propagation path and a decoding unit which performs an error correction process, an equalization unit I/O characteristic acquisition unit which acquires an I/O characteristic of the equalization unit, a decoding unit I/O characteristic acquisition unit which acquires an I/O characteristic of the decoding unit, and a decision unit which decides whether to execute a detection process in the turbo equalization unit based on the I/O characteristic acquired for each of the equalization unit and the decoding unit.

12. The radio communication system according to claim 11, wherein the decision unit evaluates whether or not a stack will occur when repeating the detection process in the turbo equalization unit based on the I/O characteristic acquired for each of the equalization unit and the decoding unit, decides that the detection process is not to be performed when it is evaluated that the stack will occur, and decides that the detection process is to be performed when it is evaluated that the stack will not occur.

13. An execution decision method performed by an execution decision apparatus which decides whether to execute a detection process for a turbo equalization apparatus which detects data before coding, by repeating processes performed on transmission data coded by error correction coding, by an equalization unit for compensating distortion by a propagation path and a decoding unit for performing an error correction process, the execution decision method comprising:
acquiring, by the execution decision apparatus, an I/O characteristic of the equalization unit;
acquiring, by the execution decision apparatus, an I/O characteristic of the decoding unit; and
judging, by the execution decision apparatus, whether to execute the detection process in the turbo equalization apparatus based on the I/O characteristic acquired for each of the equalization unit and the decoding unit.

14. The execution decision method according to claim 13, further comprising acquiring, by the execution decision apparatus, a repetition number for a repetition process in the turbo equalization apparatus based on an input characteristic of the equalization unit and an input characteristic of the decoding unit.

* * * * *